(12) United States Patent
Chae et al.

(10) Patent No.: US 12,433,004 B2
(45) Date of Patent: Sep. 30, 2025

(54) SEMICONDUCTOR DEVICE HAVING CONDUCTIVE PORTIONS IN A GROOVE AND CONTACTING A GATE INSULATING LAYER

(71) Applicant: Samsung Electronics Co., Ltd., Suwon-si (KR)

(72) Inventors: Kyo-Suk Chae, Suwon-si (KR); Dongsik Kong, Hwaseong-si (KR); Youngwook Park, Osan-si (KR); Jihoon Kim, Gwacheon-si (KR); Myung-Hyun Baek, Seoul (KR); Ju Hyung We, Hwaseong-si (KR); Jun-Bum Lee, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 418 days.

(21) Appl. No.: 17/859,472

(22) Filed: Jul. 7, 2022

(65) Prior Publication Data

US 2023/0085456 A1 Mar. 16, 2023

(30) Foreign Application Priority Data

Sep. 10, 2021 (KR) .................. 10-2021-0121123

(51) Int. Cl.
*H10D 64/27* (2025.01)
*H01L 21/02* (2006.01)
(Continued)

(52) U.S. Cl.
CPC ..... *H10D 64/513* (2025.01); *H01L 21/02112* (2013.01); *H01L 21/30604* (2013.01);
(Continued)

(58) Field of Classification Search
CPC .... H10B 12/053; H10B 12/34; H10B 12/315; H10B 12/488; H01L 21/321; H01L 21/4236
See application file for complete search history.

(56) References Cited

U.S. PATENT DOCUMENTS

2008/0122007 A1 * 5/2008 Kawai ............. H01L 21/823814
257/E29.267
2010/0330775 A1 12/2010 Shin et al.
(Continued)

FOREIGN PATENT DOCUMENTS

KR 20100077617 A * 7/2010 ........... H01L 21/288
KR 20110076507 A 7/2011
(Continued)

OTHER PUBLICATIONS

Translated KR 20100077617 A (Year: 2010) (retrieved via PE2E Search).*
(Continued)

*Primary Examiner* — Younes Boulghassoul
(74) *Attorney, Agent, or Firm* — Wolf, Greenfield & Sacks, P.C.

(57) ABSTRACT

Disclosed are a semiconductor device and a method of fabricating the same. The semiconductor device may include a substrate having a groove therein extending in a first direction, a gate insulating layer in the groove, a first conductive pattern in the groove and on the gate insulating layer, and a word line capping pattern in the groove and on the first conductive pattern. The first conductive pattern may include a first material and may include a first conductive portion adjacent to the word line capping pattern and a second conductive portion adjacent to a bottom end of the groove. A largest dimension of a grain of the first material of
(Continued)

the first conductive portion may be equal to or larger than that of the first material of the second conductive portion.

19 Claims, 41 Drawing Sheets

(51) Int. Cl.
H01L 21/306 (2006.01)
H01L 21/321 (2006.01)
H01L 21/762 (2006.01)
H01L 21/768 (2006.01)
H10B 12/00 (2023.01)
H01L 21/3105 (2006.01)

(52) U.S. Cl.
CPC ...... *H01L 21/321* (2013.01); *H01L 21/76224* (2013.01); *H01L 21/76829* (2013.01); *H10B 12/053* (2023.02); *H10B 12/34* (2023.02); *H10B 12/48* (2023.02); *H01L 21/3105* (2013.01); *H10B 12/315* (2023.02)

(56) References Cited

U.S. PATENT DOCUMENTS

| | | |
|---|---|---|
| 2011/0244673 A1 | 10/2011 | Cho et al. |
| 2011/0254083 A1 | 10/2011 | Song |
| 2014/0159145 A1* | 6/2014 | Park ..................... H10B 12/053 257/330 |
| 2017/0062470 A1* | 3/2017 | Han ....................... H10B 43/10 |
| 2018/0342518 A1* | 11/2018 | Kim ....................... H01L 29/513 |
| 2019/0115351 A1* | 4/2019 | Jeon ..................... H10B 12/488 |
| 2019/0393320 A1* | 12/2019 | Yoo ................... H01L 21/26513 |
| 2020/0395363 A1* | 12/2020 | Kim .................. H01L 21/76897 |
| 2020/0403079 A1* | 12/2020 | Hong .................. H10B 12/053 |
| 2021/0134804 A1* | 5/2021 | Jung ....................... H01L 28/60 |
| 2023/0006050 A1* | 1/2023 | Park ....................... H10B 12/34 |

FOREIGN PATENT DOCUMENTS

| | | |
|---|---|---|
| KR | 101094372 B1 | 12/2011 |
| KR | 20120052793 A | 5/2012 |
| KR | 101185990 B1 | 9/2012 |
| KR | 101211043 B1 | 12/2012 |
| KR | 101213811 B1 | 12/2012 |
| KR | 20180130189 A | 12/2018 |
| KR | 102000136 B1 | 7/2019 |
| KR | 102000169 B1 | 7/2019 |
| KR | 10-2020-0000915 A | 1/2020 |
| KR | 10-2021-0053379 A | 5/2021 |

OTHER PUBLICATIONS

Translated Abstract KR 20100077617 A (Year: 2010) (retrieved via Google Patents).*

* cited by examiner

SEMICONDUCTOR DEVICE HAVING CONDUCTIVE PORTIONS IN A GROOVE AND CONTACTING A GATE INSULATING LAYER

CROSS-REFERENCE TO RELATED APPLICATION(S)

This U.S. non-provisional patent application claims priority under 35 U.S.C. § 119 to Korean Patent Application No. 10-2021-0121123, filed on Sep. 10, 2021, in the Korean Intellectual Property Office, the entire contents of which are hereby incorporated by reference.

BACKGROUND

The present disclosure relates to semiconductor devices. Due to their small-size, multifunctional, and/or low-cost characteristics, semiconductor devices are being esteemed as important elements in the electronics industry. With the advancement of the electronics industry, there is an increasing demand for a semiconductor device with higher integration density. To increase the integration density of the semiconductor device, linewidths of patterns constituting the semiconductor device may be reduced. However, novel and expensive exposure technologies may be needed to reduce the linewidths of the patterns, and thus, it may become difficult to increase the integration density of the semiconductor device. Accordingly, a variety of studies on new technology for increasing integration density of a semiconductor device are being actively conducted.

SUMMARY

An embodiment of the inventive concept provides a semiconductor device with improved reliability.

According to an embodiment of the inventive concept, a method of fabricating a semiconductor device with improved reliability is provided.

According to an embodiment of the inventive concept, a semiconductor device may include a substrate having a groove therein extending in a first direction, a gate insulating layer in the groove, a first conductive pattern in the groove and on the gate insulating layer, and a word line capping pattern in the groove and on the first conductive pattern. The first conductive pattern may include a first material, and the first conductive pattern may include a first conductive portion that is adjacent to the word line capping pattern and a second conductive portion that is adjacent to a bottom end of the groove. A largest dimension of a grain of the first material of the first conductive portion may be equal to or larger than a largest dimension of a grain of the first material of the second conductive portion.

According to an embodiment of the inventive concept, a semiconductor device may include a substrate having a groove therein extending in a first direction, a gate insulating layer in the groove, a first conductive pattern in the groove and on the gate insulating layer, and a word line capping pattern in the groove and on the first conductive pattern. The first conductive pattern may include a first material, and the first conductive pattern may include a first conductive portion that is adjacent to the word line capping pattern and a second conductive portion that is adjacent to a bottom end of the groove. The gate insulating layer may include a first insulating portion below the first conductive pattern. At least one of the first conductive portion, the second conductive portion, or the first insulating portion may include an impurity. An impurity content of the first conductive portion may be lower than an impurity content of the first insulating portion.

According to an embodiment of the inventive concept, a semiconductor device may include a substrate having a groove therein extending in a first direction, a gate insulating layer in the groove, a first conductive pattern in the groove and on the gate insulating layer, a word line capping pattern in the groove and on the first conductive pattern, a second conductive pattern between the first conductive pattern and the word line capping pattern, a first impurity region in the substrate at a side of the word line capping pattern, a second impurity region in the substrate at an opposite side of the word line capping pattern, a bit line that is on the substrate, extends in a second direction crossing the first direction, and is electrically connected to the first impurity region, a bit line contact between the bit line and the first impurity region, a bit line capping pattern on the bit line, a storage node contact on the second impurity region, and a landing pad on the storage node contact and on the bit line capping pattern. The first conductive pattern may include a first material, and the second conductive pattern may include a second material. A work function of the second material may be greater than a work function of the first material, and a largest dimension of a grain of the second material in the second conductive pattern may be larger than a largest dimension of a grain of the first material in the first conductive pattern. The largest dimension of the grain of the first material may range from 10 nm to 20 nm.

According to an embodiment of the inventive concept, a method of fabricating a semiconductor device may include forming a groove in a substrate, conformally forming a gate insulating layer in the groove, forming a first conductive layer on the gate insulating layer in the groove, etching the first conductive layer in an etch-back manner to form a first conductive pattern in the groove, performing a first thermal treatment process after forming the first conductive pattern, and forming a word line capping pattern on the first conductive pattern.

DETAILED DESCRIPTION

Example embodiments of the inventive concepts will now be described more fully with reference to the accompanying drawings, in which example embodiments are shown.

Figure 1:
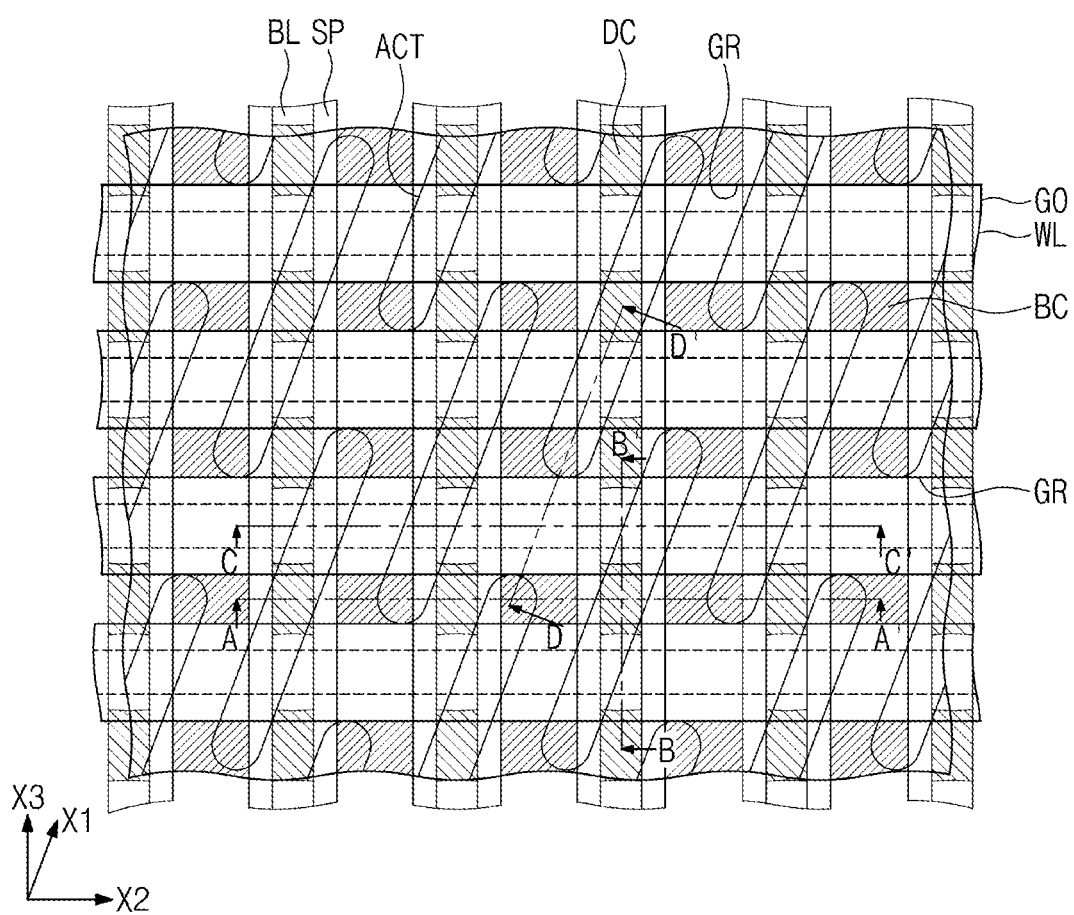
FIG. 1 is a plan view illustrating a semiconductor device according to an embodiment of the inventive concept.
Figure 2A:
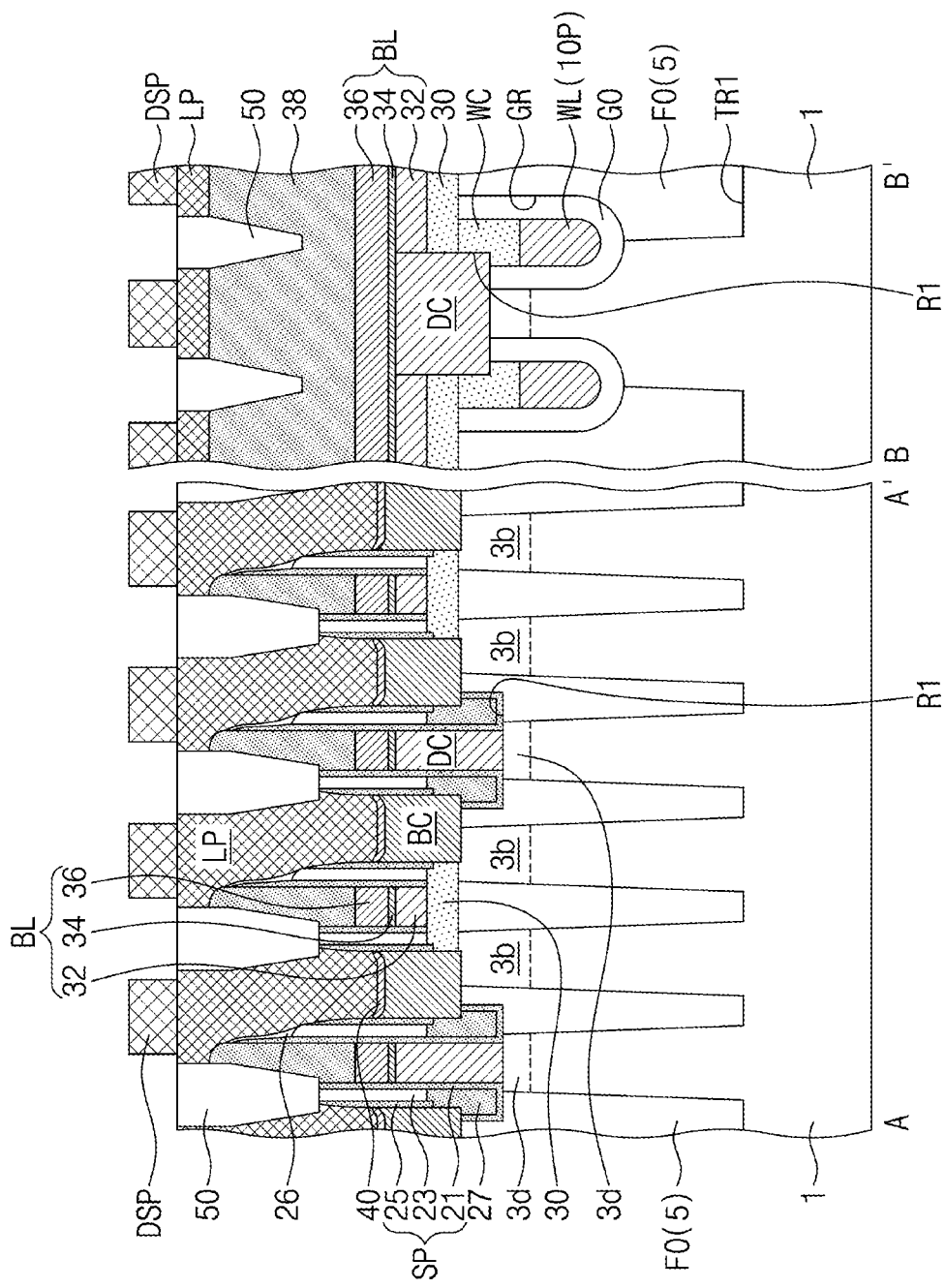
FIG. 2A is a sectional view taken along lines A-A' and B-B' of FIG. 1.
Figure 2B:
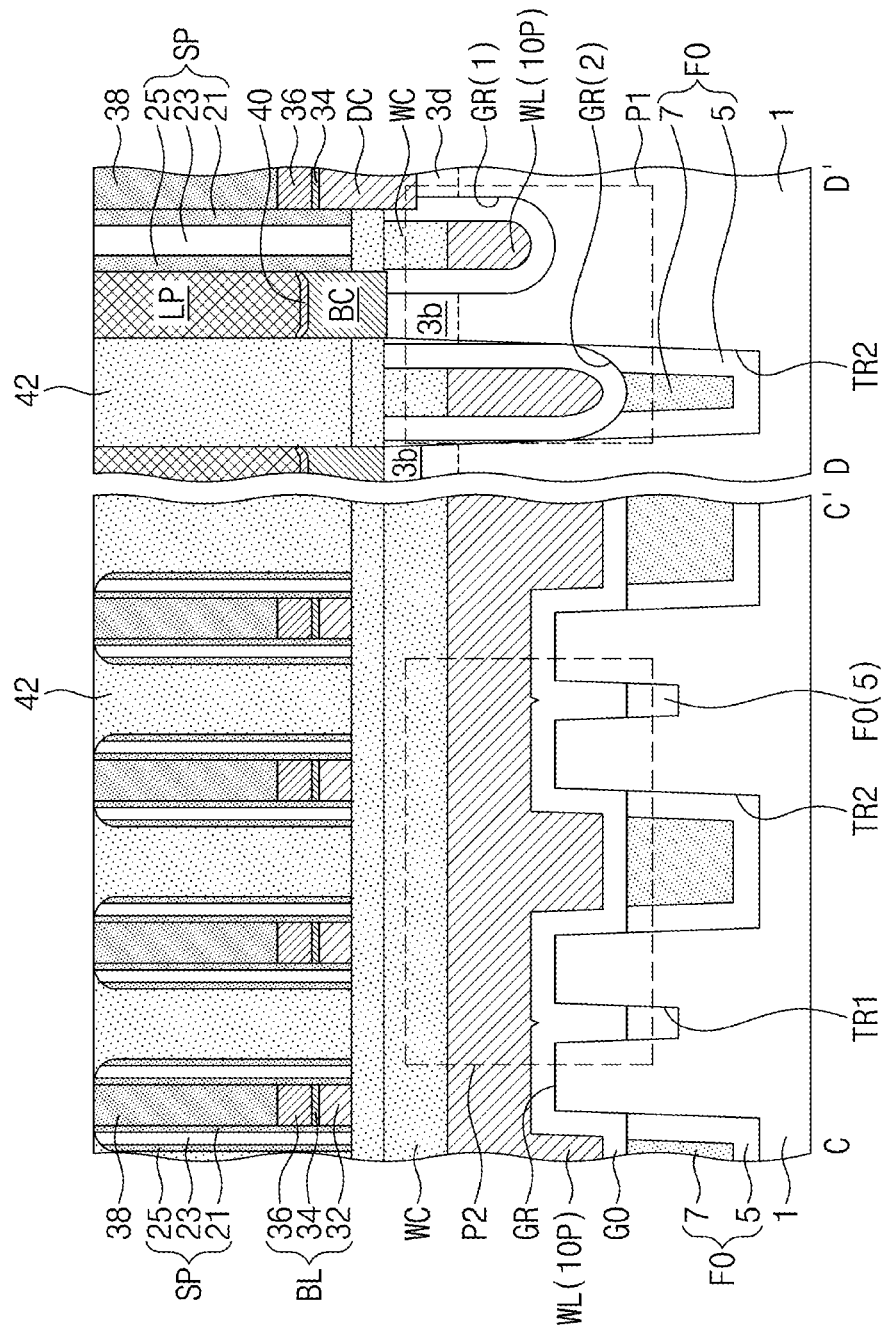
FIG. 2B is a sectional view taken along lines C-C' and D-D' of FIG. 1.
Figure 3A:
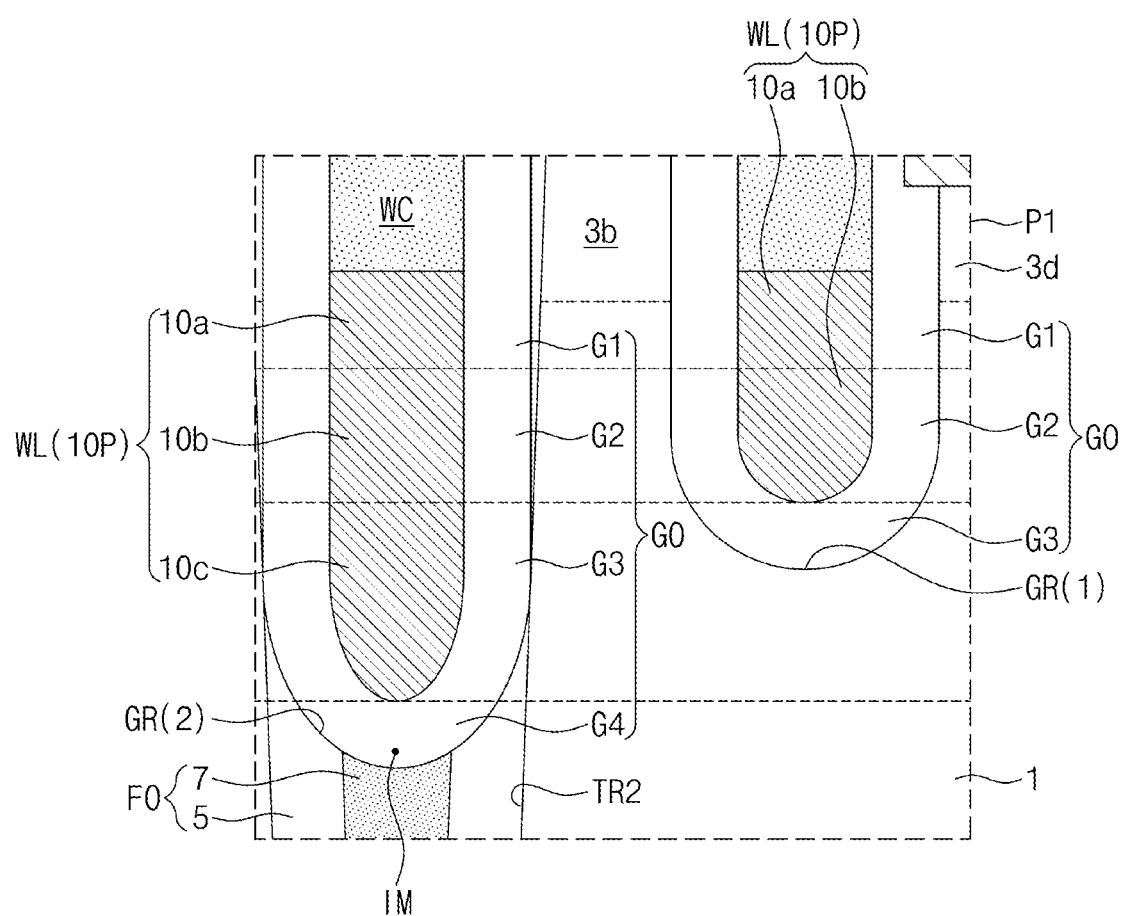
FIG. 3A is an enlarged sectional view illustrating a portion (e.g., 'P1' of FIG. 2B) of a semiconductor device according to an embodiment of the inventive concept.
Figure 3B:
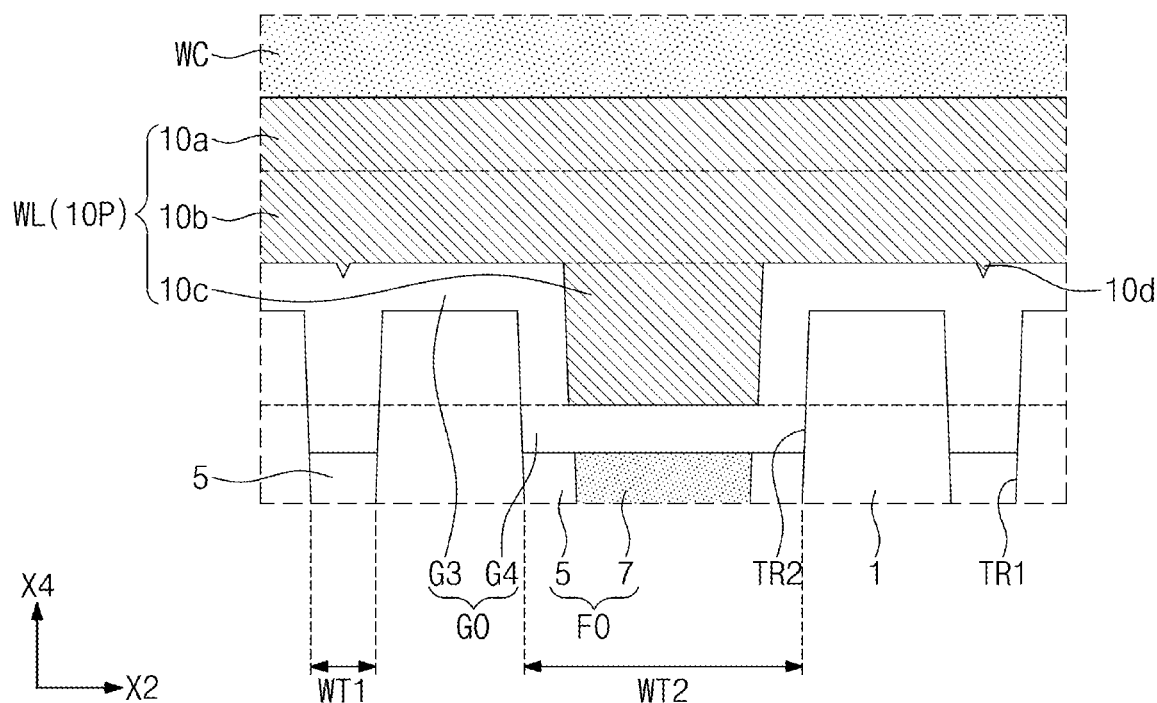
FIG. 3B is an enlarged sectional view illustrating a portion (e.g., 'P2' of FIG. 2B) of a semiconductor device according to an embodiment of the inventive concept.
Figure 4:
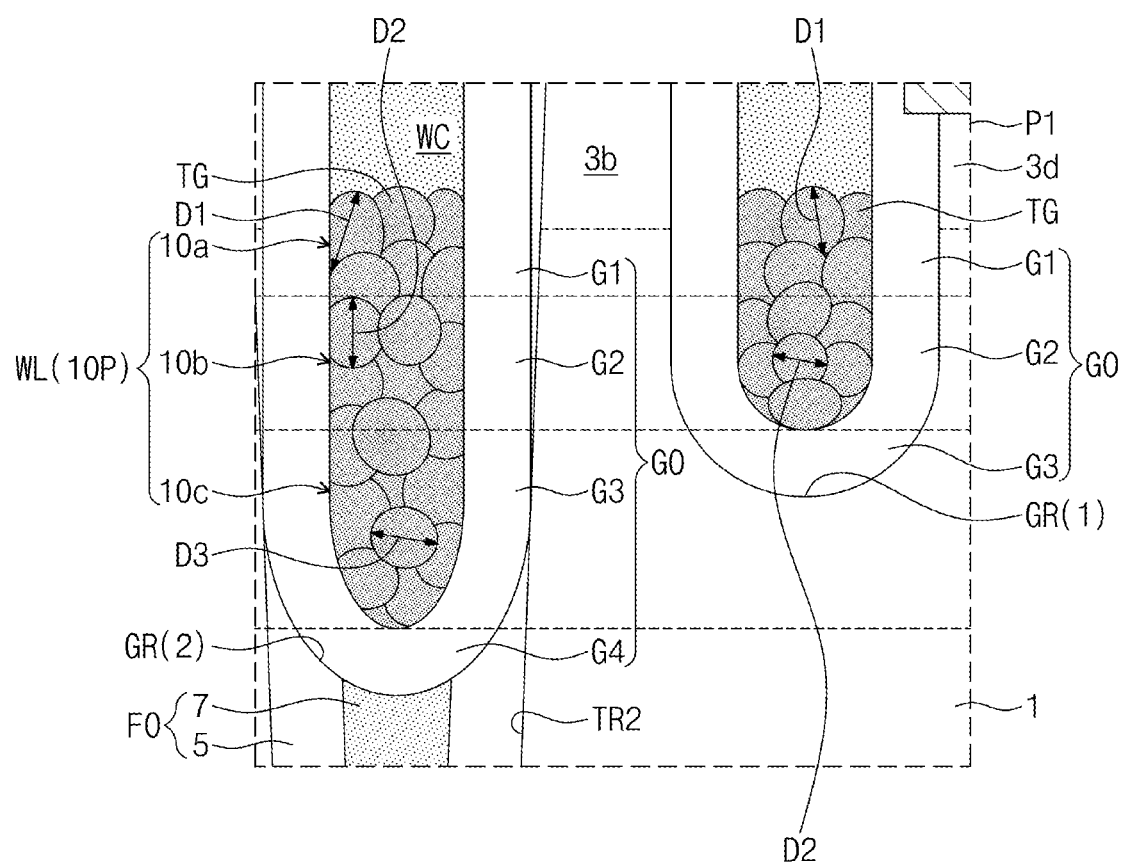
FIG. 4 is an enlarged sectional view illustrating a portion (e.g., 'P1' of FIG. 2B) of a semiconductor device according to an embodiment of the inventive concept.

FIG. 1 is a plan view illustrating a semiconductor device according to an embodiment of the inventive concept. FIG. 2A is a sectional view taken along lines A-A' and B-B' of FIG. 1. FIG. 2B is a sectional view taken along lines C-C' and D-D' of FIG. 1. FIG. 3A is an enlarged sectional view illustrating a portion (e.g., 'P1' of FIG. 2B) of a semiconductor device according to an embodiment of the inventive concept. FIG. 3B is an enlarged sectional view illustrating a portion (e.g., 'P2' of FIG. 2B) of a semiconductor device according to an embodiment of the inventive concept. FIG. 4 is an enlarged sectional view illustrating a portion (e.g., 'P1' of FIG. 2B) of a semiconductor device according to an embodiment of the inventive concept.

Referring to FIGS. 1, 2A, 2B, 3A, and 3B, a substrate 1 may be provided. In an embodiment, the substrate 1 may be a single-crystalline silicon substrate or a silicon-on-insulator (SOI) substrate. A device isolation layer FO may be disposed in the substrate 1 to define active portions ACT. Each of the active portions ACT may have an isolated shape. Each of the active portions ACT may be a bar-shaped pattern extending in a first direction X1, when viewed in a plan view. The active portions ACT may correspond to portions of the substrate 1 enclosed by the device isolation layer FO, when viewed in a plan view. The substrate 1 may be formed of or include a semiconductor material. For example, the substrate 1 may be a silicon substrate, a germanium substrate, or a silicon-germanium substrate. The device isolation layer FO may be formed of or include at least one of oxide materials (e.g., silicon oxide), nitride materials (e.g., silicon nitride), and/or oxynitride materials (e.g., silicon oxynitride). The active portions ACT may be arranged to be parallel to the first direction X1 and to each other, and each active portion ACT may be disposed to have an end portion that is adjacent to a center of another active portion ACT adjacent thereto.

The device isolation layer FO may be disposed in a first trench TR1 and a second trench TR2, which are formed in the substrate 1. The first trench TR1 may have a first width WT1 in a second direction X2 crossing the first direction X1. The second trench TR2 may have a second width WT2 in the second direction X2. The second width WT2 may be larger than the first width WT1.

The device isolation layer FO may include a first device isolation layer 5 and a second device isolation layer 7. Each of the first and second device isolation layers 5 and 7 may independently be formed of or include at least one of silicon oxide, silicon nitride, or silicon oxynitride. The second device isolation layer 7 may be formed of or include a material having an etch selectivity with respect to the first device isolation layer 5. For example, the second device isolation layer 7 may be formed of or include silicon nitride, and the first device isolation layer 5 may be formed of or include silicon oxide.

The first device isolation layer 5 may be provided in (e.g., to fill) at least a lower portion of the first trench TR1 and on (e.g., to cover) side and bottom surfaces of the second trench TR2. The second device isolation layer 7 may be in contact with the first device isolation layer 5, in the second trench TR2. The second device isolation layer 7 may be provided in (e.g., to fill) at least a lower portion of the second trench TR2. The first and second device isolation layers 5 and 7 may be recessed to expose an upper side surface of each of the first trench TR1 and the second trench TR2.

Grooves GR may be formed in the substrate 1 and the device isolation layer FO. The grooves GR may be extended in the second direction X2 and may be spaced apart from each other in a third direction X3, which is not parallel to either of the first and second directions X1 and X2. A bottom surface (e.g., a bottom end/portion that includes a lowermost point) of the groove GR may have an uneven (e.g., non-planar) structure, as shown in FIG. 2B. A top surface of the substrate 1 below the groove GR may be higher than a top surface of the device isolation layer FO below the groove GR.

A gate insulating layer GO may be disposed in each of the grooves GR. The gate insulating layer GO may include a silicon oxide layer and/or a high-k dielectric layer. The high-k dielectric layer may be formed of or include a material whose dielectric constant is higher than that of the silicon oxide layer. For example, the high-k dielectric layer may be formed of or include at least one of metal oxide materials (e.g., aluminum oxide). The gate insulating layer GO may be provided in the grooves GR, such as to conformally cover inner surfaces (e.g., side and bottom surfaces) of the grooves GR. The gate insulating layer GO may be provided to have an uneven (e.g., non-planar) structure along the bottom of the groove GR.

A portion of the gate insulating layer GO may be inserted into the first trench TR1 to fill an upper portion of the first trench TR1. Another portion of the gate insulating layer GO may be inserted into the second trench TR2 on (e.g., to cover) the inner side surface of the second trench TR2 and the top surface of the device isolation layer FO.

Word lines WL may be disposed in the grooves GR, respectively. Each of the word lines WL may have a curved bottom surface. The bottom surface of the word line WL on the device isolation layer FO may be lower than the bottom surface of the word line WL on the active portion ACT. The word line WL may be composed of a first conductive pattern 10P. The first conductive pattern 10P may be formed of a first conductive material. The first conductive material may be one of, for example, titanium nitride (TiN), molybdenum (Mo), tungsten (W), copper (Cu), aluminum (Al), tantalum nitride (TaN), ruthenium (Ru), and iridium (Ir). The first conductive pattern 10P may be provided in (e.g., to fill) at least a lower portion of the groove GR. In the groove GR, any other conductive pattern may not be present between the first conductive pattern 10P and the gate insulating layer GO. A top surface of the first conductive pattern 10P may be flat (as shown in FIG. 3A), concave (as shown in FIG. 16D), or uneven (as shown in FIG. 4). The first conductive pattern 10P will be described in more detail below.

Each of the active portions ACT may include a first impurity region 3d, which is provided between a pair of the word lines WL, and a pair of second impurity regions 3b, which are provided at opposite edge regions thereof. The first and second impurity regions 3d and 3b may be doped with for example n-type impurities. The first impurity region 3d may correspond to a common drain region, and the second impurity regions 3b may correspond to source regions. Each of the word lines WL and the first and second impurity regions 3d and 3b adjacent thereto may constitute a transistor. Since the word line WL is disposed in the groove GR, a channel length of a channel region below the word line WL may be increased within a limited planar area. Thus, it may be possible to suppress the short channel effect or the like. The grooves GR may include a first groove GR(1) and a second groove GR(2), which are adjacent to each other.

A top surface of the word line WL may be lower than a top surface of the active portion ACT. A word line capping pattern WC may be disposed on each of the word lines WL. Each of the word line capping patterns WC may be provided to have a line-shaped structure extended in a length direction of the word line WL and to cover the entire top surface of the word line WL. The word line capping patterns WC may be in (e.g., may fill) the grooves GR on the word lines WL. In an embodiment, the word line capping pattern WC may be formed of or include silicon nitride.

An interlayer insulating pattern 30 may be disposed on the substrate 1. The interlayer insulating pattern 30 may be formed of or include at least one of silicon oxide, silicon nitride, or silicon oxynitride and may have a single- or multi-layered structure. The interlayer insulating pattern 30 may be formed to have an isolated island shape, when viewed in a plan view. Alternatively, the interlayer insulating pattern 30 may be formed to have a mesh shape, when viewed in a plan view. The interlayer insulating pattern 30, an upper portion of each of the substrate 1, the device isolation layer FO, and the word line capping pattern WC may be partially recessed to form a first recess region R1.

Bit lines BL may be disposed on the interlayer insulating pattern 30. The bit lines BL may be provided to cross the word line capping patterns WC and the word lines WL. As shown in FIG. 1, the bit lines BL may be parallel to the third direction X3 crossing the first and second directions X1 and X2.

The bit line BL may include a bit line polysilicon pattern 32, a bit line diffusion prevention pattern 34, and a bit line interconnection pattern 36, which are sequentially stacked. The bit line polysilicon pattern 32 may be formed of or include doped polysilicon. The bit line diffusion prevention pattern 34 may be formed of or include at least one of titanium, titanium nitride (TiN), titanium silicon nitride (TiSiN), tantalum, tantalum nitride, or tungsten nitride. The bit line interconnection pattern 36 may be formed of or include at least one of metallic materials (e.g., tungsten, aluminum, and copper). A bit line capping pattern 38 may be disposed on each of the bit lines BL. The bit line capping patterns 38 may be formed of or include at least one of various insulating materials (e.g., silicon nitride).

Bit line contacts DC may be disposed in the first recess region R1, which is provided to cross the bit lines BL. The bit line contacts DC may be formed of or include doped or undoped polysilicon. When viewed in the B-B' section of FIG. 2A, a side surface of the bit line contact DC may be in contact with a side surface of the interlayer insulating pattern 30. When viewed in the plan view of FIG. 1, at least one of side surfaces of the bit line contact DC may be concave. The bit line contact DC may be used to electrically connect the first impurity region 3d to the bit line BL.

A lower gapfill insulating pattern 27 may be disposed in a portion of the first recess region R1, in which the bit line contact DC is not disposed. The lower gapfill insulating pattern 27 may be formed of or include at least one of silicon oxide, silicon nitride, or silicon oxynitride and may have a single- or multi-layered structure.

Storage node contacts BC may be disposed between an adjacent pair of the bit lines BL. The storage node contacts BC may be spaced apart from each other. The storage node contacts BC may be formed of or include doped or undoped polysilicon. The storage node contact BC may have a concave top surface.

An insulating fence 42 may be disposed between the bit lines BL and between the storage node contacts BC. The insulating fence 42 may be formed of or include at least one of various insulating materials (e.g., silicon nitride, silicon oxide, or silicon oxynitride). A top end of the insulating fence 42 may be located at a level higher than top ends of the storage node contacts BC.

A bit line spacer SP may be interposed between the bit line BL and the storage node contact BC. The bit line spacer SP may also be on (e.g., cover) a side surface of the bit line capping pattern 38. The bit line spacer SP may include first to third spacers 21, 23, and 25, which are sequentially disposed on the side surface of the bit line BL. The first and third spacers 21 and 25 may be formed of or include a material having an etch selectivity with respect to the second spacer 23. For example, the first and third spacers 21 and 25 may be formed of or include silicon nitride. In this case, the second spacer 23 may be formed of or include silicon oxide. Alternatively, the second spacer 23 may be an air gap region.

The first spacer 21 may be downwardly extended to be on (e.g., to cover) the side surface of the bit line contact DC. The first spacer 21 may be interposed between the lower gapfill insulating pattern 27 and the device isolation layer FO. When viewed in the A-A section of FIG. 2A, a top end of the first spacer 21 may be located at a level higher than top ends of the second and third spacers 23 and 25. An upper side surface of the first spacer 21 may not be covered with the second and third spacers 23 and 25. This may make it possible to increase a process margin in a subsequent process of forming a landing pad LP. Thus, it may be possible to inhibit/prevent the landing pad LP from being disconnected from the storage node contact BC.

An upper portion of the first spacer 21 may have a thickness that is smaller than that of a lower portion thereof. The upper side surface of the first spacer 21 may be covered with a fourth spacer 26. In an embodiment, the fourth spacer 26 may be formed of or include silicon nitride. The fourth spacer 26 may be used to reinforce the thinned upper portion of the first spacer 21.

A storage node ohmic layer 40 may be disposed on the storage node contact BC. The storage node ohmic layer 40 may be formed of or include at least one of various metal silicide materials. A landing pad LP may be disposed on the storage node ohmic layer 40. Although not shown, a diffusion barrier layer may be interposed between the storage node ohmic layer 40 and the landing pad LP. The diffusion barrier layer may be formed of or include at least one of various metal nitride materials. The landing pad LP may be formed of or include a metal-containing material (e.g., tungsten). An upper portion of the landing pad LP may be on (e.g., may cover) a top surface of the bit line capping pattern 38. A center of the landing pad LP may be shifted from a center of the storage node contact BC in the second direction X2. A portion of the bit line BL may be vertically overlapped by the landing pad LP.

A landing pad separation pattern 50 may be disposed between the landing pads LP. The landing pad separation pattern 50 may be formed of or include at least one of silicon oxide, silicon nitride, silicon oxynitride, or silicon oxycarbide (SiOC) and may have a single- or multi-layered structure. The landing pad separation pattern 50 may be downwardly extended to penetrate a portion of the bit line capping pattern 38 and to be in contact with the second spacer 23.

A data storage DSP may be disposed on the landing pad LP. The data storage DSP may be a capacitor including a bottom electrode, a dielectric layer, and a top electrode. Or the data storage DSP may include a magnetic tunnel junction pattern. In an embodiment, the data storage DSP may include a phase-change material or a variable-resistance material.

Referring to FIG. 3A, the word line WL according to an embodiment of the inventive concept may consist of only the first conductive pattern 10P. For example, at least the lower portion of the groove GR covered with the gate insulating layer GO may be filled with the first conductive pattern 10P. The word line WL may have a 'single structure' (e.g., single layer) that is composed of only the first conductive pattern 10P. The word line WL may thus be free of any conductive layer/pattern other than the first conductive pattern 10P. Accordingly, the groove GR may be free of any conductive material (e.g., any metal) therein other than that of the first conductive pattern 10P. In an embodiment, the first conductive pattern 10P may be formed of or include TiN. In this case, the word line WL may have a relatively low resistivity.

Figure 5:
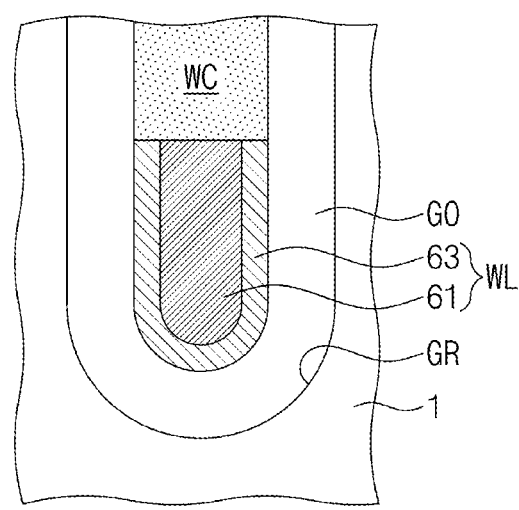
FIG. 5 is a sectional view illustrating a semiconductor device according to a comparative example.

FIG. 5 is a sectional view illustrating a semiconductor device according to a comparative example.

Referring to FIG. 5, in a semiconductor device according to a comparative example, the word line WL may include a first metal-containing pattern 61 and a second metal-containing pattern 63. The second metal-containing pattern 63 may be interposed between the first metal-containing pattern 61 and the gate insulating layer GO. The first metal-containing pattern 61 and the second metal-containing pattern 63 may be formed of or include metallic materials that are different from each other. For example, the first metal-containing pattern 61 may be formed of or include tungsten, and the second metal-containing pattern 63 may be formed of or include TiN. In the comparative example, the word line WL may have a 'double structure' that is composed of the first metal-containing pattern 61 and the second metal-containing pattern 63.

Figure 6A:
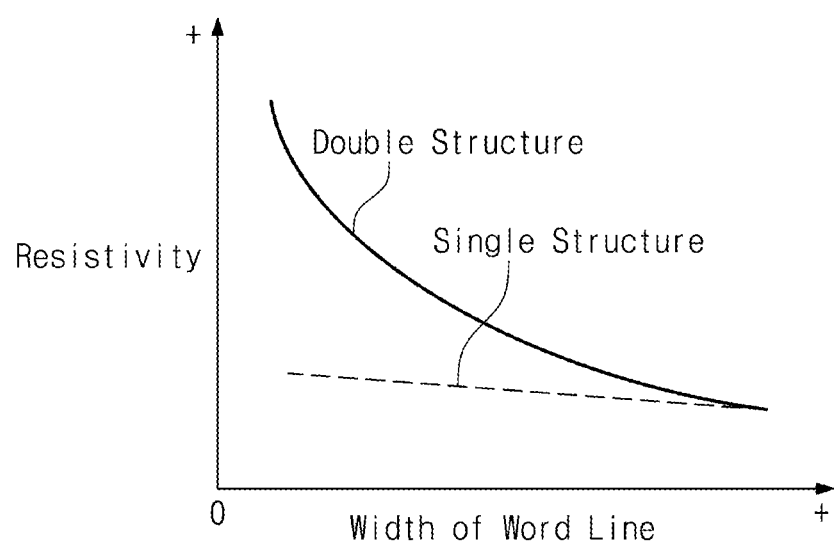
FIG. 6A is a graph showing a change in resistivity caused by a change in width of a word line.

FIG. 6A is a graph showing a change in resistivity caused by a change in width of a word line.

Referring to FIG. 6A, when a width of a word line decreased, the resistivity of the word line of the single structure slightly increased, whereas the resistivity of the word line of the double structure increased significantly. As an integration density of a semiconductor device increases, the width of the word line is decreasing. This means that the word line of the single structure of FIG. 3A (i.e., according to some embodiments) may have a relatively low resistivity, even when the word line has a reduced width; that is, it may be possible to improve an operation speed of the semiconductor device. In other words, by virtue of this structure of the word line, the semiconductor device according to some embodiments may have excellent properties (e.g., high density and fast operation speed).

Figure 6B:
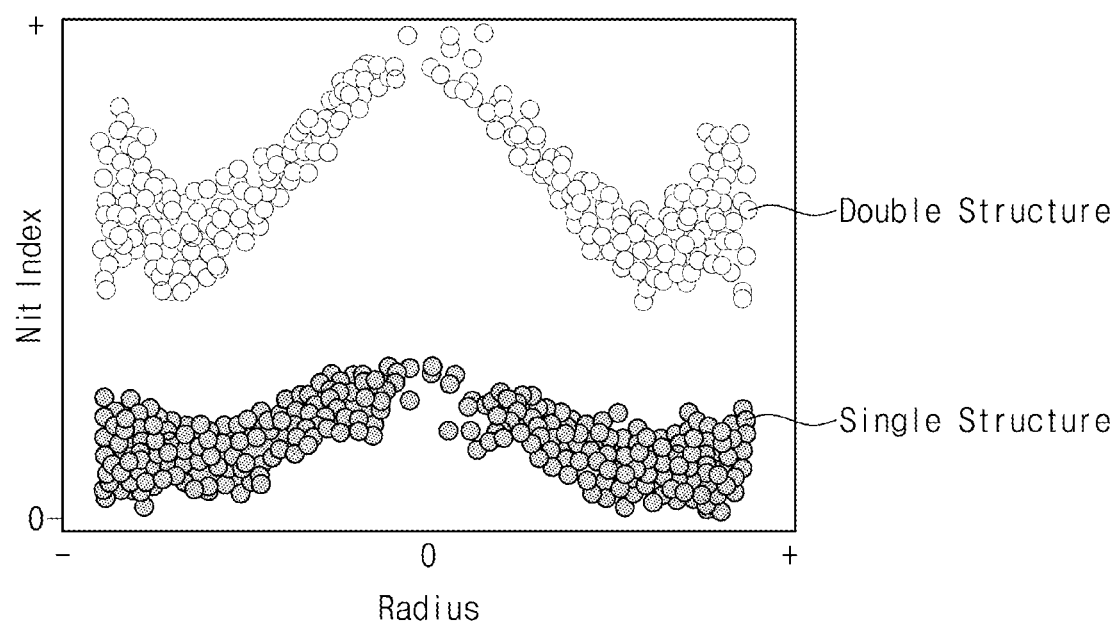
FIG. 6B is a graph showing a change in Nit index caused by a change in radius of a word line.

FIG. 6B is a graph showing a change in Nit index caused by a change in radius of a word line.

Referring to FIG. 6B, the word line of the single structure (i.e., according to some embodiments) has a Nit (Number of interface trap) index that was smaller than that in the word line of the double structure (i.e., according to the comparative example). That is, the word line of the single structure (i.e., according to some embodiments) had fewer interface traps, and this means that it is possible to reduce a leakage current caused by the interface traps. This may make it possible to improve reliability of the semiconductor device.

Figure 6C:
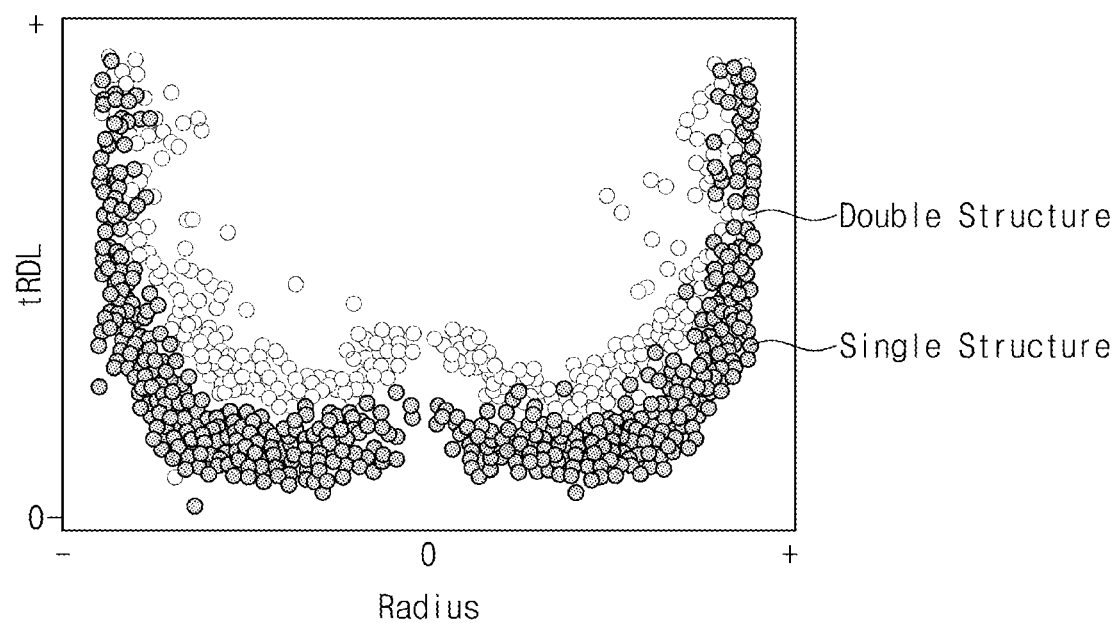
FIG. 6C is a graph showing a change in tRDL caused by a change in radius of a word line.

FIG. 6C is a graph showing a change in tRDL caused by a change in radius of a word line.

Referring to FIG. 6C, the word line of the single structure (i.e., according to some embodiments) had a tRDL (Last Data-in to Row pre-charge Timing) smaller than that in the word line of the double structure (i.e., according to the comparative example). This means that in some embodiments, it is possible to improve the tRDL property of the semiconductor device, to increase an operation speed of the semiconductor device, and to operate the semiconductor device with reduced power consumption.

Referring back to FIGS. 3A and 3B, the first conductive pattern 10P may have a first conductive portion 10a, a second conductive portion 10b, and a third conductive portion 10c. The first conductive portion 10a, the second conductive portion 10b, and the third conductive portion 10c may be provided to form a single object. The first conductive portion 10a may be adjacent to the word line capping pattern WC. The second conductive portion 10b may be disposed below the first conductive portion 10a. The first conductive portion 10a and the second conductive portion 10b may be extended in the first direction X1. The third conductive portion 10c may protrude from the second conductive portion 10b into the second trench TR2. The second conductive portion 10b may include a portion 10d, which is located on the center of the first trench TR1 and protrudes in a downward direction. In the sectional view of FIG. 3A, the third conductive portion 10c may not be seen in the first groove GR(1), but the third conductive portion 10c may be seen in the second groove GR(2).

The gate insulating layer GO may include first to fourth insulating portions G1 to G4, which are provided to form a single object. The first insulating portion G1 may be placed beside the first conductive portion 10a. The second insulating portion G2 may be placed beside the second conductive portion 10b. The third insulating portion G3 may be placed below the second conductive portion 10b. The fourth insulating portion G4 may be placed below the third conductive portion 10c.

At least one of the first to third conductive portions 10a to 10c and the first to fourth insulating portions G1 to G4 may contain an impurity IM. In an embodiment, the impurity IM may be at least one of nitrogen, chlorine, boron, iodine, fluorine, bromine, carbon, or hydrogen.

An impurity content of the first conductive portion 10a may be lower than an impurity content of the third or fourth insulating portion G3 or G4. An impurity content of the second conductive portion 10b may be lower than an impurity content of the third or fourth insulating portion G3 or G4. In some embodiments, the term "content" may mean an atomic concentration.

The first to third conductive portions 10a to 10c may have the same impurity content. Alternatively, the larger the depth in the first conductive pattern 10P, the higher the impurity content. For example, the impurity content of the second conductive portion 10b may be lower than the impurity content of the third conductive portion 10c and may be higher than the impurity content of the first conductive portion 10a.

In the gate insulating layer GO, the larger the depth, the higher the impurity content. For example, among the first to fourth insulating portions G1 to G4, the first insulating portion G1 may have the lowest impurity content, and the fourth insulating portion G4 may have the highest impurity content. The impurity content of the third insulating portion G3 may be lower than the impurity content of the fourth insulating portion G4 and may be higher than the impurity content of the second insulating portion G2.

In some embodiments, the first conductive portion 10a and the second conductive portion 10b, which correspond to a line portion of the word line WL and are adjacent to the first and second impurity region 3d and 3b, may have a low impurity content. Furthermore, the first insulating portion G1 adjacent to the first and second impurity region 3d and 3b may have an impurity content that is relatively lower than other insulating portions G2 to G4. Thus, it may be possible to reduce the Nit index and to improve the tRDL property, and thus, the semiconductor device may be fabricated to have an increased operation speed and high reliability.

Referring to FIG. 4, the first conductive pattern 10P may be formed of a first conductive material. The first conductive pattern 10P may include first grains TG of the first conductive material. In the first conductive portion 10a, the first grains TG may have a first mean size D1. In some embodiments, the 'mean size' of the grains may mean diameters of the grains or the largest dimension (e.g., largest size/width) of the grains. In the second conductive portion 10b, the first grains TG may have a second mean size D2. In the third conductive portion 10c, the first grains TG may have a third mean size D3. Each of the first to third mean sizes D1, D2, and D3 may range from 10 nanometers (nm) to 20 nm. In an embodiment, the first mean size D1 may be equal to or larger than the second mean size D2. The second mean size D2 may be equal to or larger than the third mean size D3.

In an embodiment, the first grains TG of the first conductive portion 10a, which corresponds to the line portion of the word line WL and is adjacent to the first and second impurity regions 3d and 3b, may have a relatively large mean size D1. Thus, an electrical resistance of the first conductive portion 10a may be reduced, and this may make it possible to improve the tRDL property. Furthermore, since an interface portion between the first grains TG is reduced in the first conductive portion 10a, it may be possible to reduce the Nit index. Accordingly, it may be possible to improve an operating speed and reliability of the semiconductor device.

Figure 7:
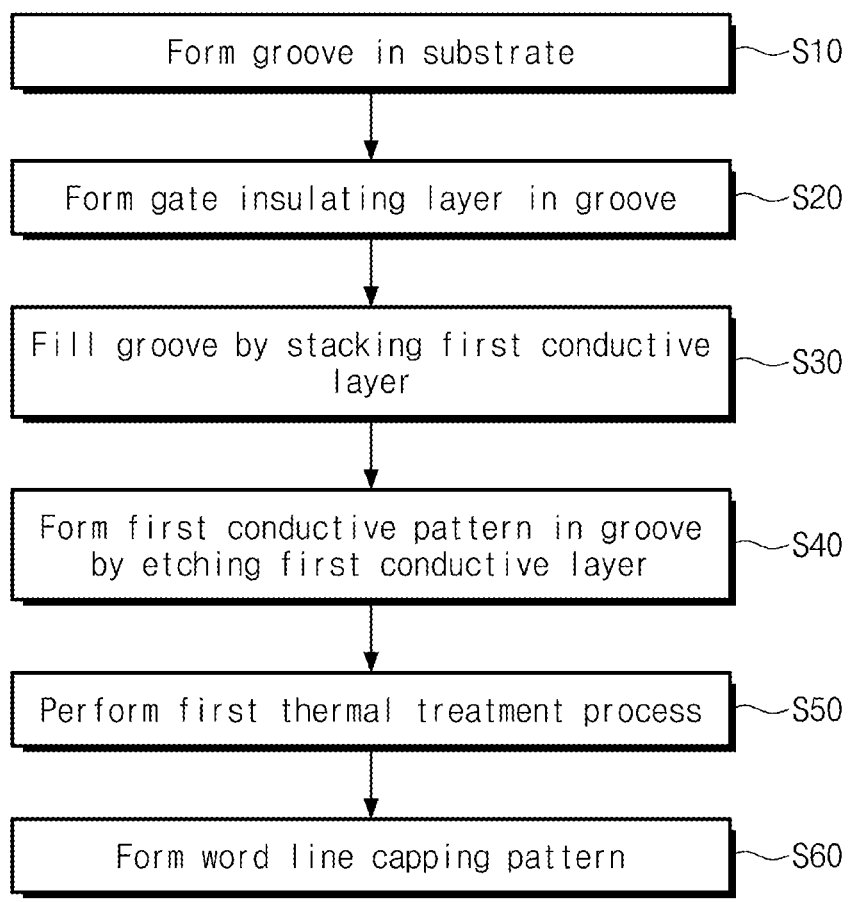
FIG. 7 is a flow chart illustrating a method of fabricating a semiconductor device according to an embodiment of the inventive concept.

FIG. 7 is a flow chart illustrating a method of fabricating a semiconductor device according to an embodiment of the inventive concept. FIGS. 8A, 9A, 10A, and 15A are plan views, which are presented to sequentially describe a method of fabricating a semiconductor device having the planar structure of FIG. 1. FIGS. 8B, 9B, 10B, 11A, 12A, 13A, and 15B are sectional views, which are presented to sequentially describe a method of fabricating a semiconductor device having the sectional structure of FIG. 2A. FIGS. 8C, 9C, 10C, 11B, 12B, 13B, and 15C are sectional views, which are presented to sequentially describe a method of fabricating a semiconductor device having the sectional structure of FIG. 2B. Here, FIGS. 8B, 9B, 10B, and 15B are sectional views taken along lines A-A' and B-B' of FIGS. 8A, 9A, 10A, and 15A, respectively. FIGS. 8C, 9C, 10C, and 15C are sectional views taken along lines C-C' and D-D' of FIGS. 8A, 9A, 10A, and 15A, respectively.

Figure 8A:
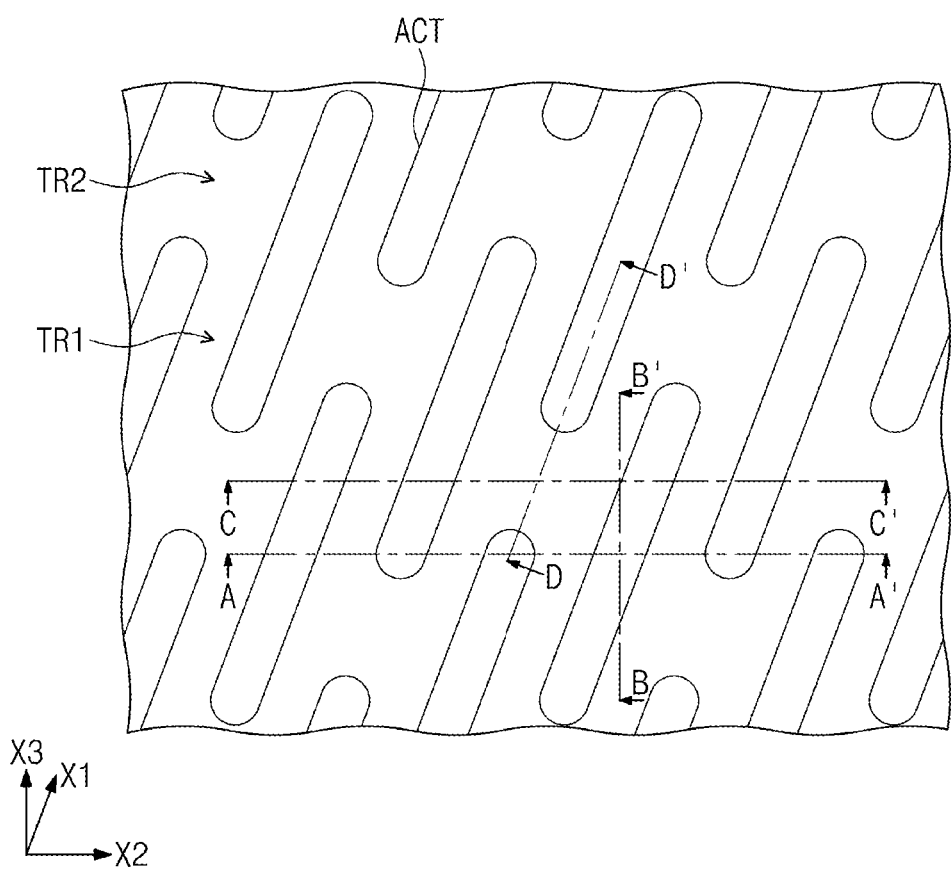
FIGS. 8A, 9A, 10A, and 15A are plan views, which are presented to sequentially describe a method of fabricating a semiconductor device having the planar structure of FIG. 1.
Figure 8B:
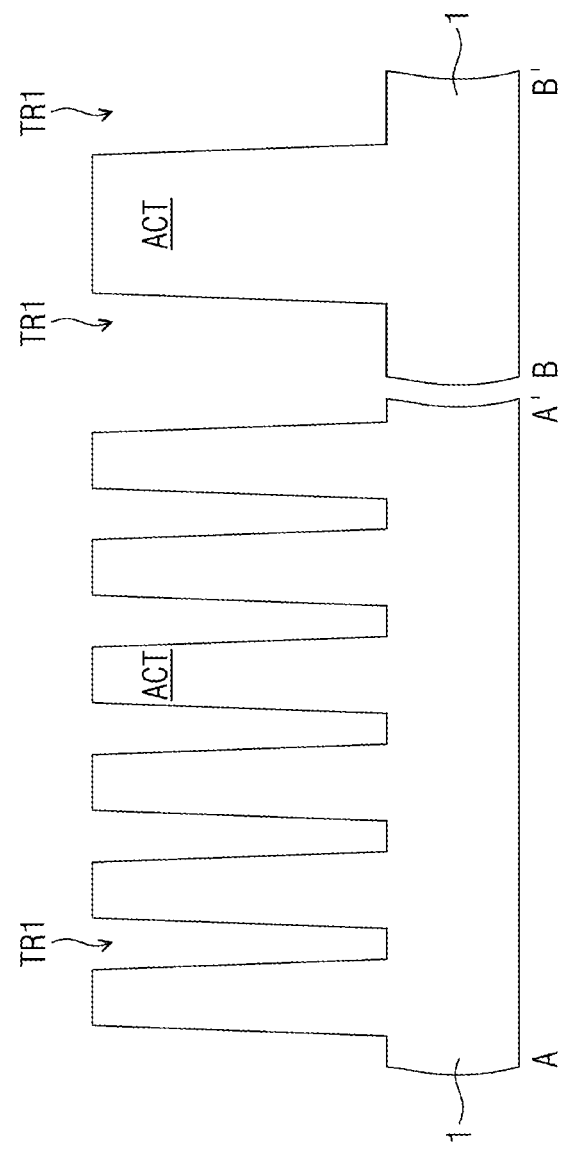
FIGS. 8B, 9B, 10B, 11A, 12A, 13A, and 15B are sectional views, which are presented to sequentially describe a method of fabricating a semiconductor device having the sectional structure of FIG. 2A.
Figure 8C:
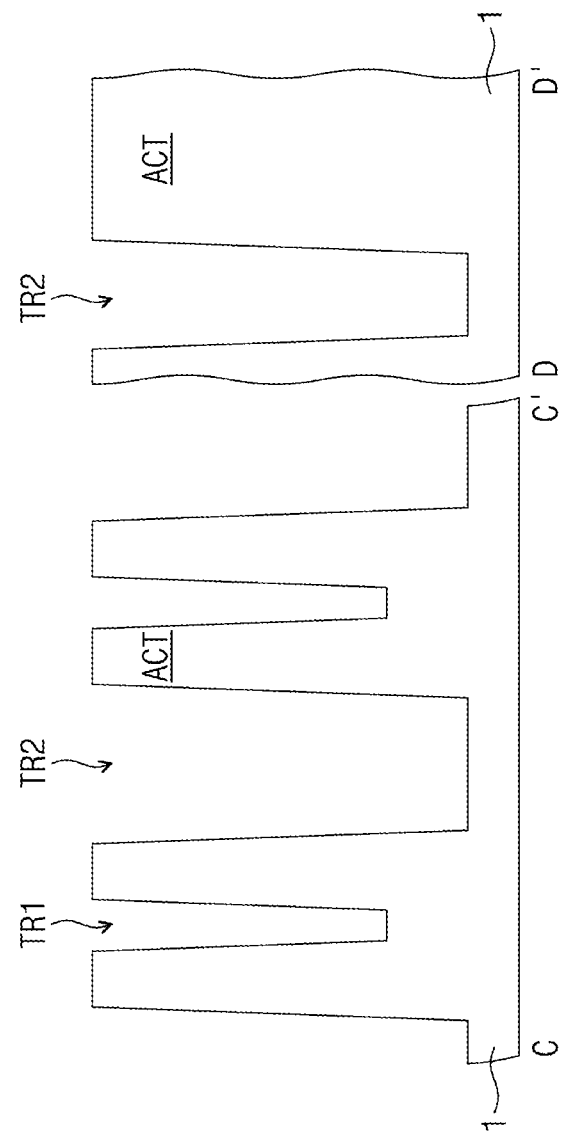
FIGS. 8C, 9C, 10C, 11B, 12B, 13B, and 15C are sectional views, which are presented to sequentially describe a method of fabricating a semiconductor device having the sectional structure of FIG. 2B.

Referring to FIGS. 8A, 8B, and 8C, the substrate 1 may be prepared. The substrate 1 may be etched to form the first trenches TR1 and the second trenches TR2 and to define the active portions ACT. The second trenches TR2 may be formed to have the second width WT2, which is larger than the first width WT1 of the first trenches TR1, as shown in FIG. 3B. In this case, due to a loading effect, the second trenches TR2 may be formed to have a depth that is larger than that of the first trenches TR1.

Figure 9A:
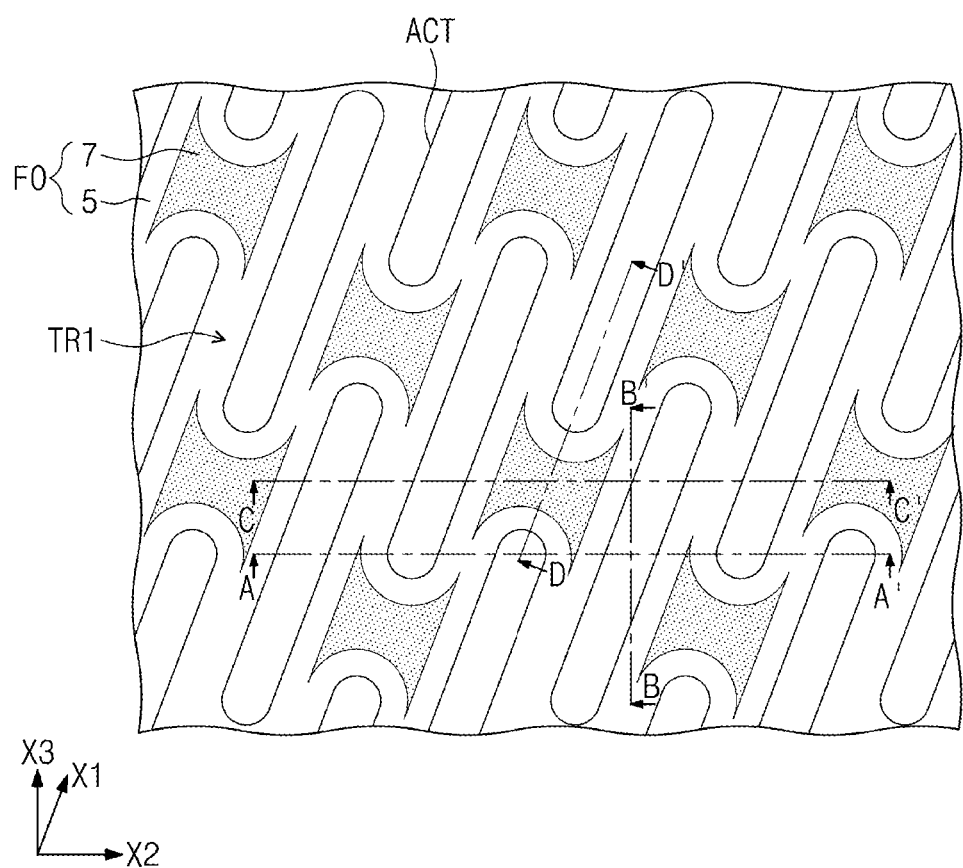
Figure 9B:
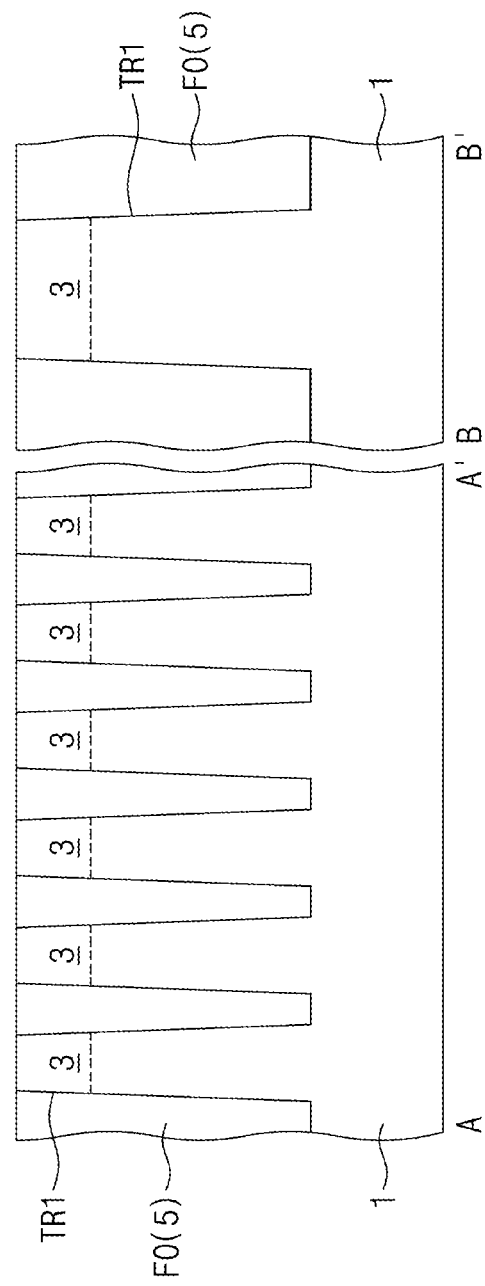
Figure 9C:
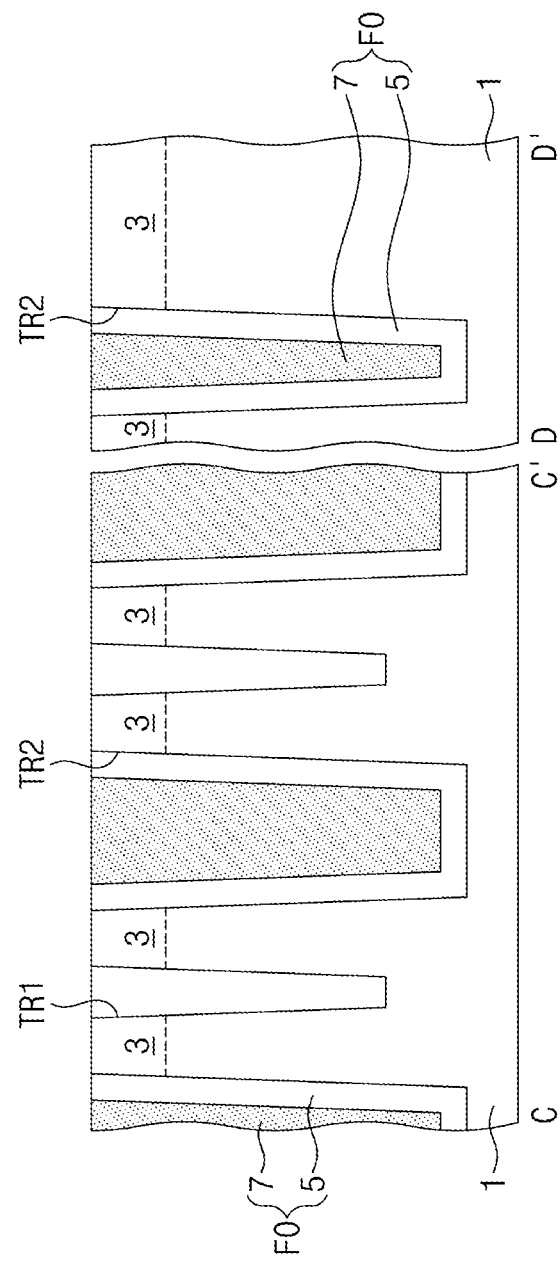
Figure 10A:
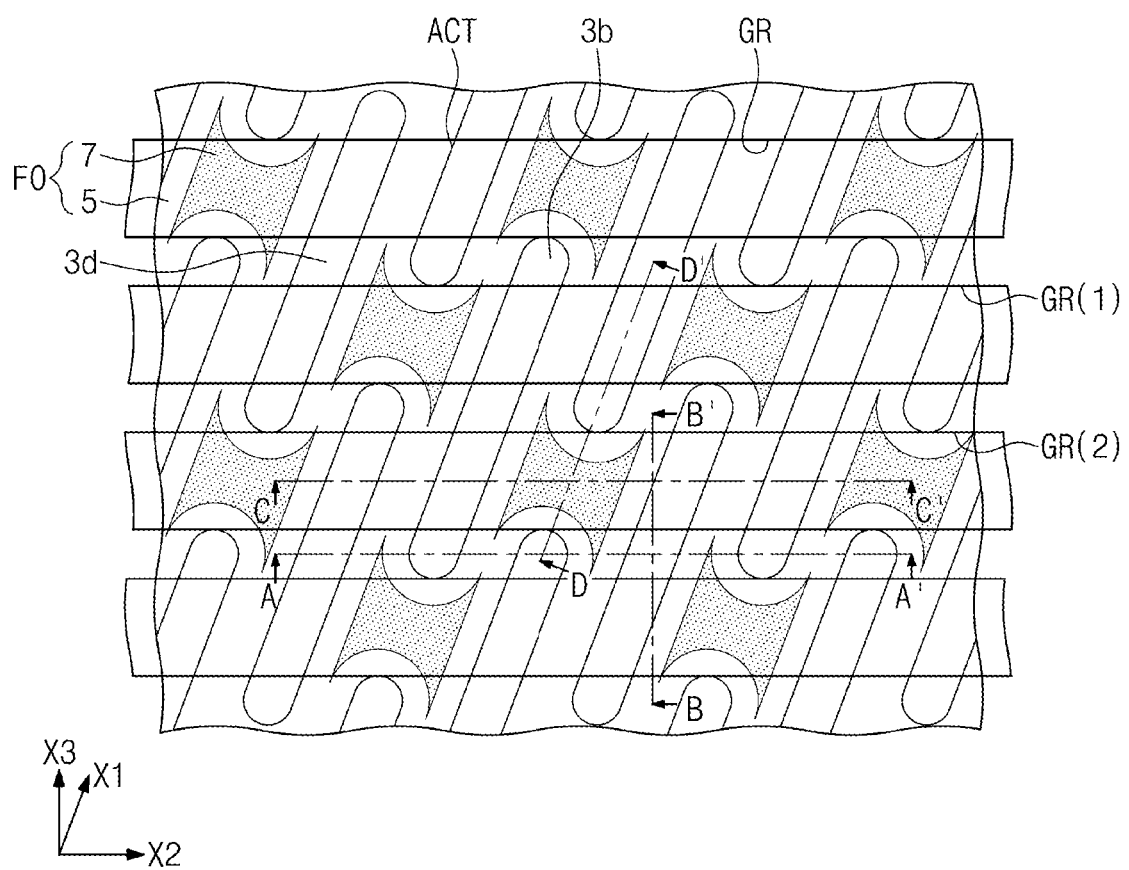
Figure 10B:
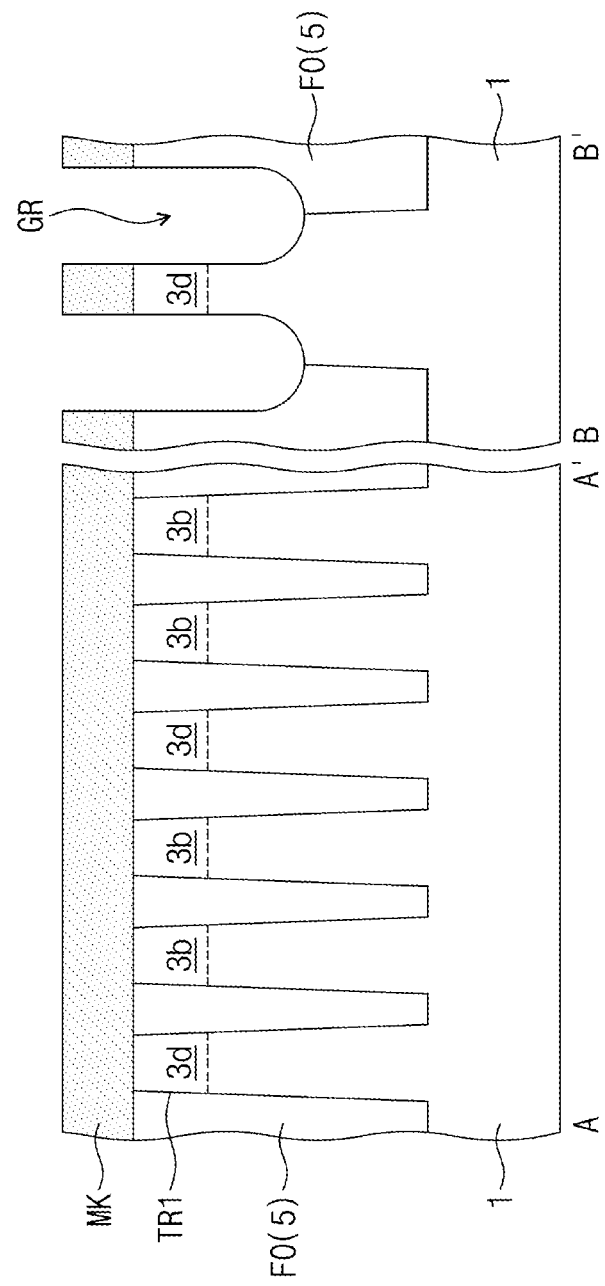
Figure 10C:
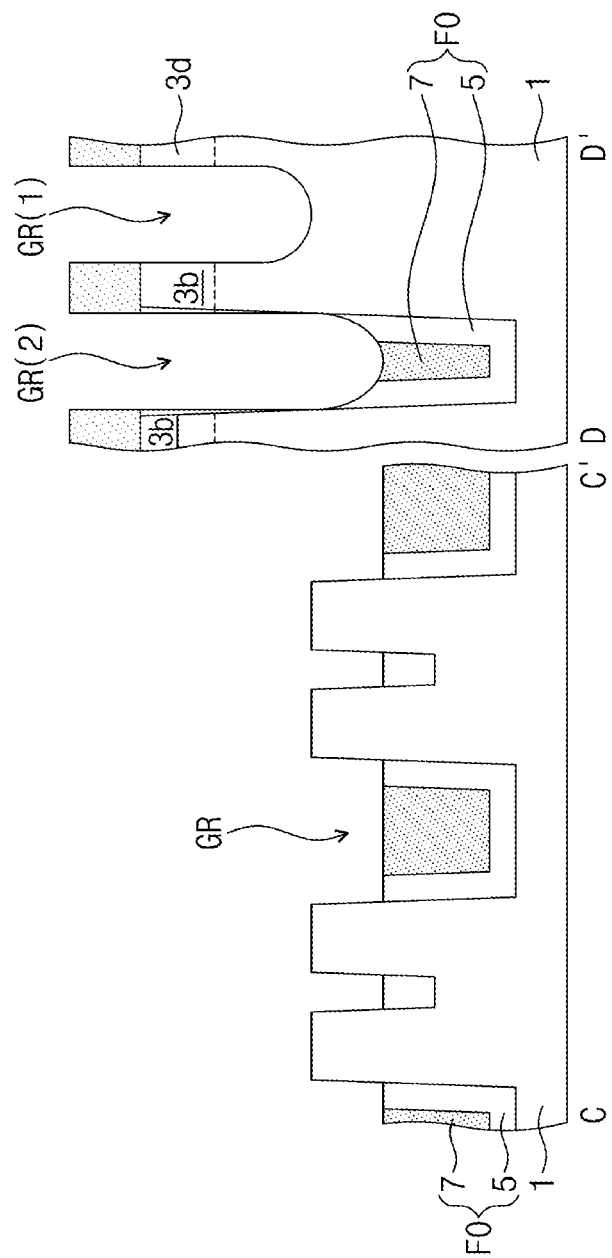

Referring to FIGS. 9A, 9B, and 9C, the first device isolation layer 5 may be conformally formed on the substrate 1. The first device isolation layer 5 may be formed to have a thickness that is enough large to fill the first trenches TR1 but is too small to fill the second trenches TR2. That is, the first trenches TR1 may be filled with the first device isolation layer 5. The second device isolation layer 7 may be formed on the first device isolation layer 5 to fill the second trenches TR2. A chemical mechanical polishing (CMP) process or an etch-back process may be performed to remove portions of the first and second device isolation layers 5 and 7 on the substrate 1 and to form the device isolation layer FO in the first and second trenches TR1 and TR2. The second device isolation layer 7 of the device isolation layer FO may have the shape shown in FIG. 9A, when viewed in a plan view. Next, an ion implantation process may be performed to form impurity regions 3 in an upper portion of the substrate 1.

Referring to FIGS. 7, 10A, 10B, and 10C, a mask pattern MK may be formed on the substrate 1 to define positions and shapes of the grooves GR. The mask pattern MK may be formed of or include at least one of photoresist materials, spin-on-hardmask (SOH) materials, SiOC, silicon oxynitride (SiON), or silicon germanium. The grooves GR may be formed in the substrate 1 and the device isolation layer FO by using the mask pattern MK as an etch mask (in S10). The bottom surface of the groove GR may have an uneven structure. As a result of the formation of the grooves GR, the impurity regions 3 may be divided into the first and second impurity regions 3d and 3b.

Figure 11A:
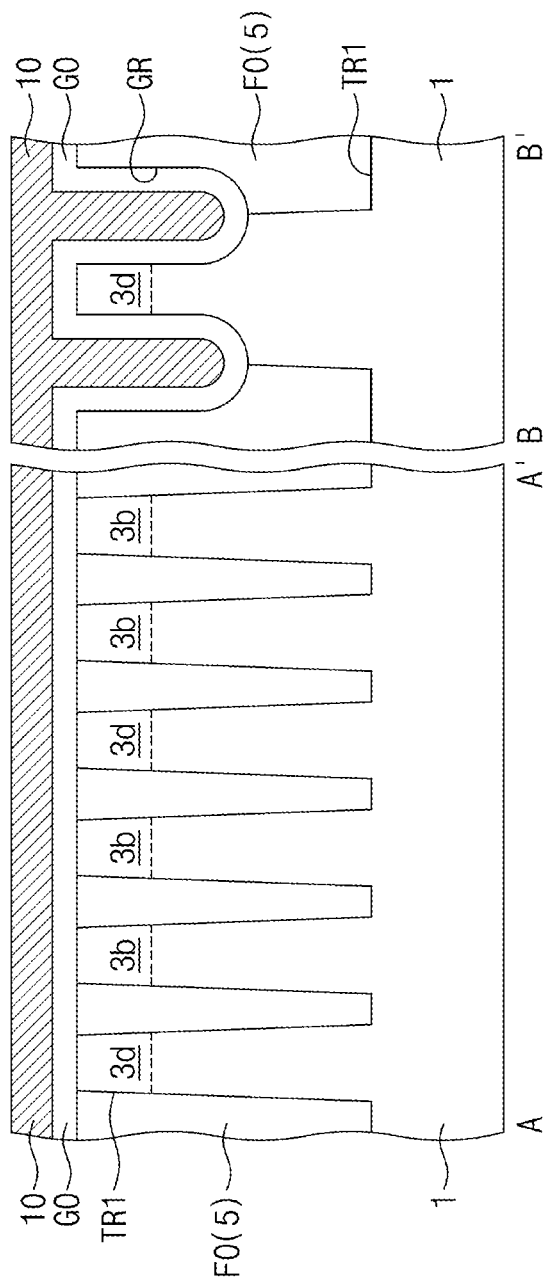
Figure 11B:
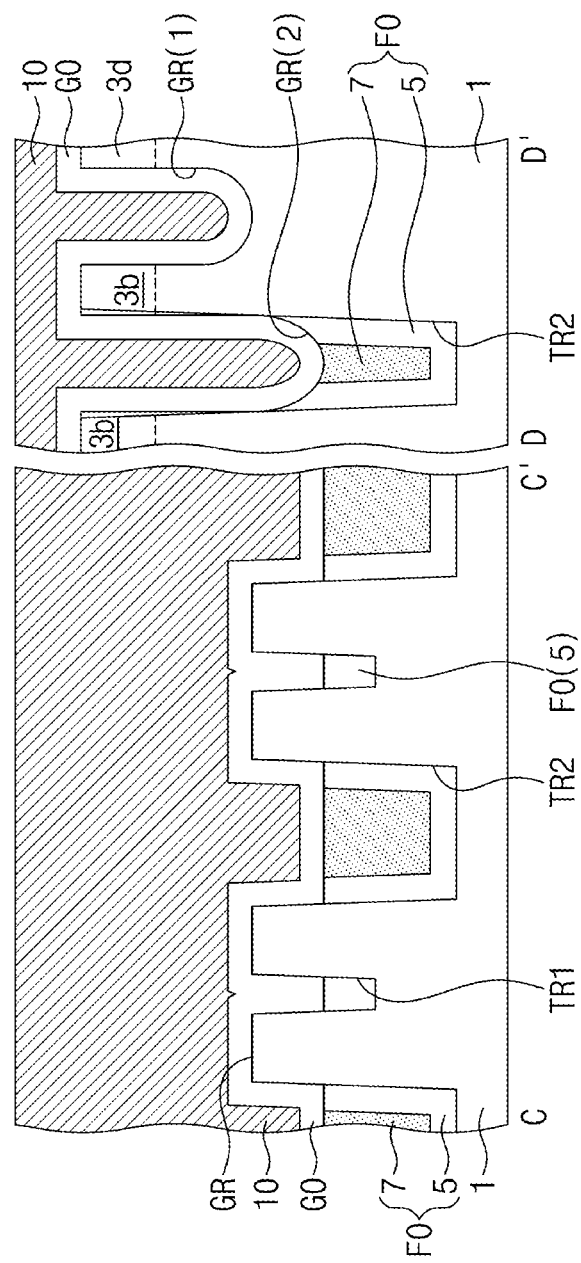

Referring to FIGS. 7, 11A, and 11B, the mask pattern MK may be removed to expose the substrate 1. The gate insulating layer GO may be conformally formed on the substrate 1 and in the grooves GR (in S20). Next, a first conductive layer 10 may be formed on the gate insulating layer GO to fill the grooves GR (in S30). Each of the gate insulating layer GO and the first conductive layer 10 may be formed by a chemical vapor deposition (CVD) or an atomic layer deposition (ALD) process including a step of supplying one or more source gases. Each of the source gases may contain not only main elements, which constitute the gate insulating layer GO or the first conductive layer 10, but also a halogen element, boron, nitrogen, carbon, or hydrogen, which is coupled with the main element. Here, the halogen element may be fluorine, chlorine, bromine, or iodine.

Figure 12A:
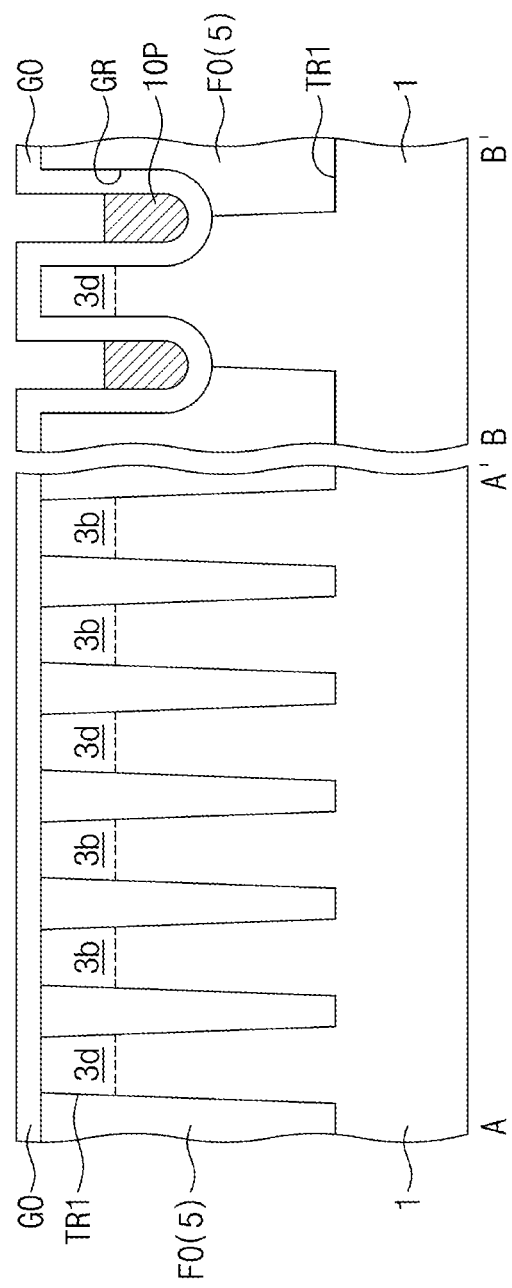
Figure 12B:
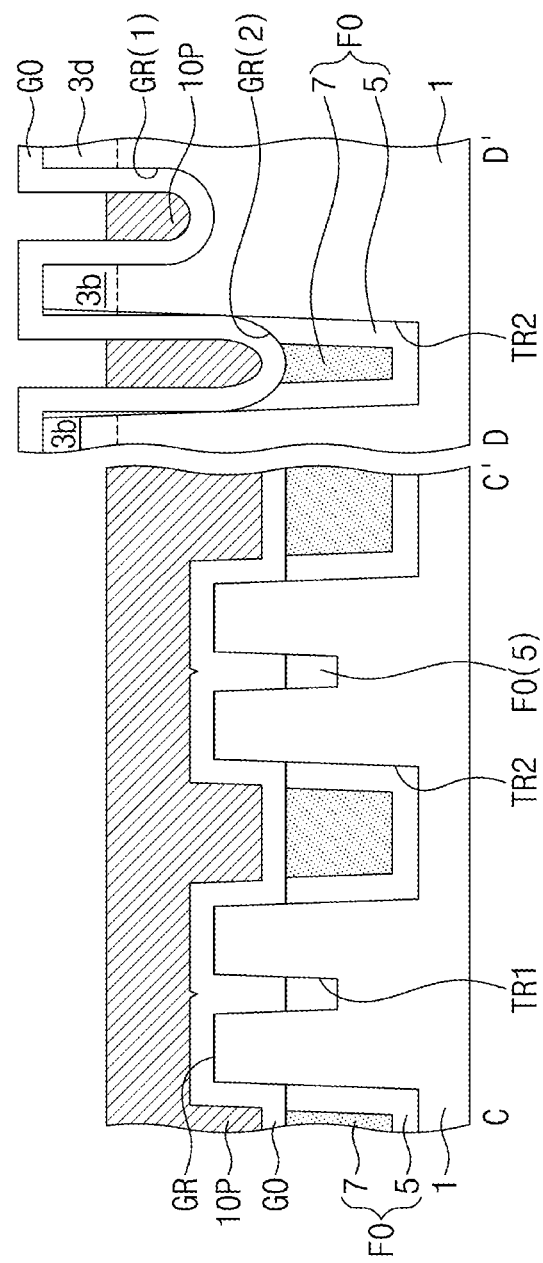
Figure 13A:
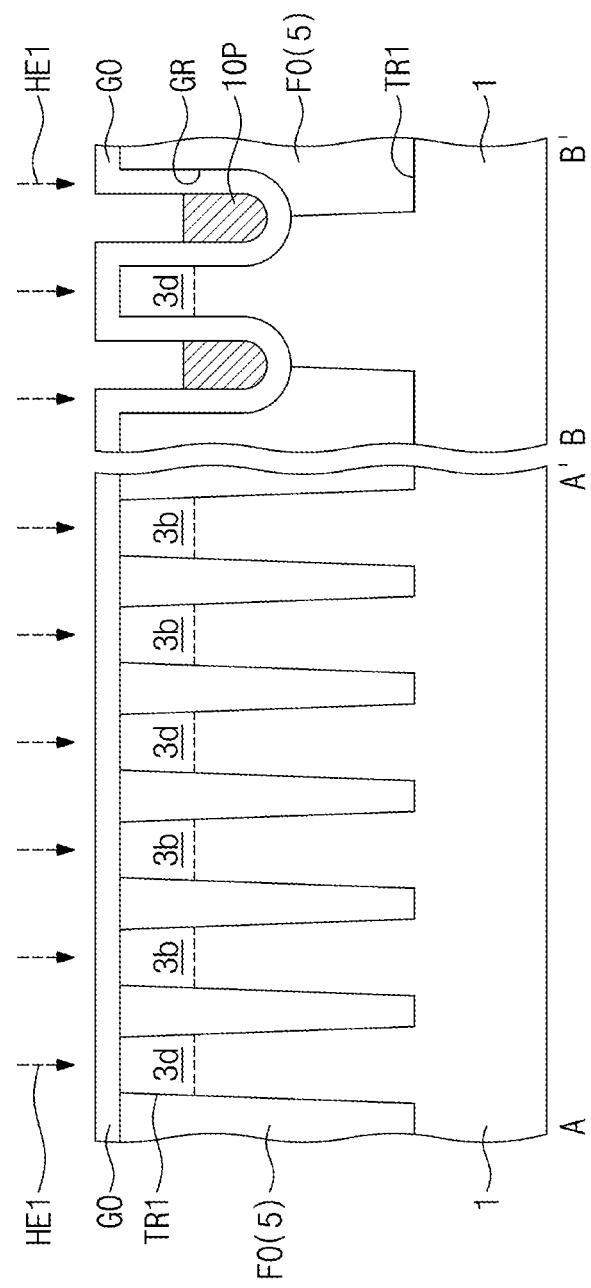
Figure 13B:
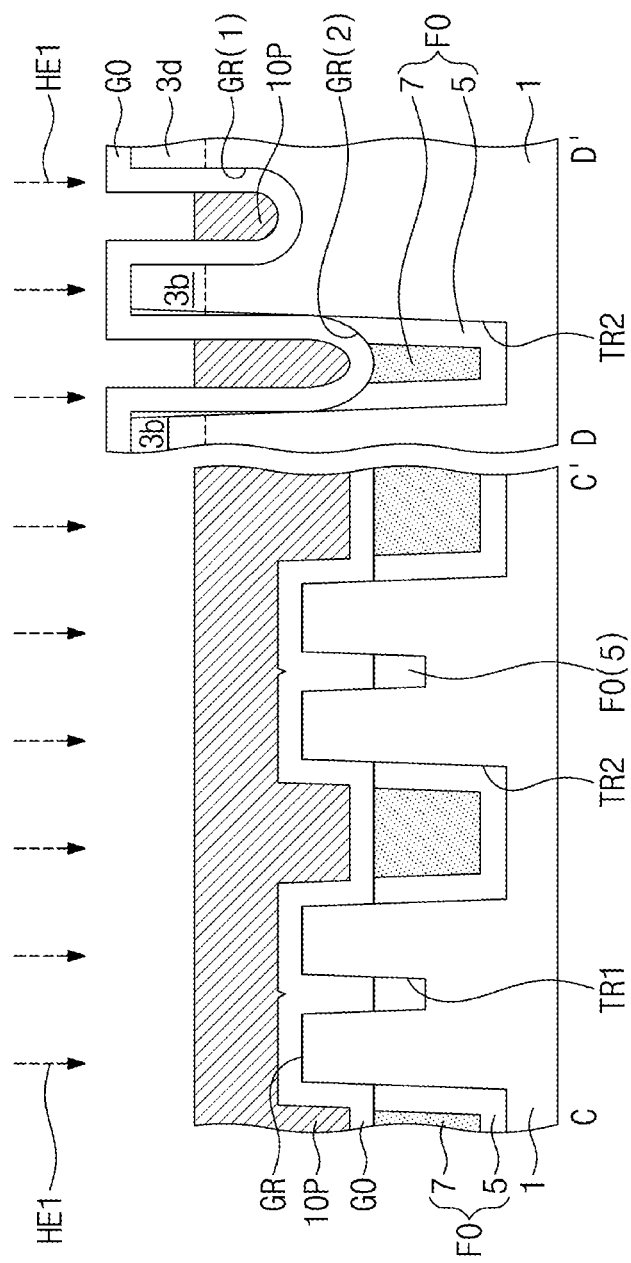

Referring to FIGS. 7, 12A, and 12C, the first conductive layer 10 may be etched back to form first conductive patterns 10P in the groove GR (in S40). The etch-back process may be performed using etchants. In an embodiment, the etchants may contain a halogen element. After the formation of the first conductive patterns 10P, an upper surface of the gate insulating layer GO in the groove GR may be exposed.

Figure 14:
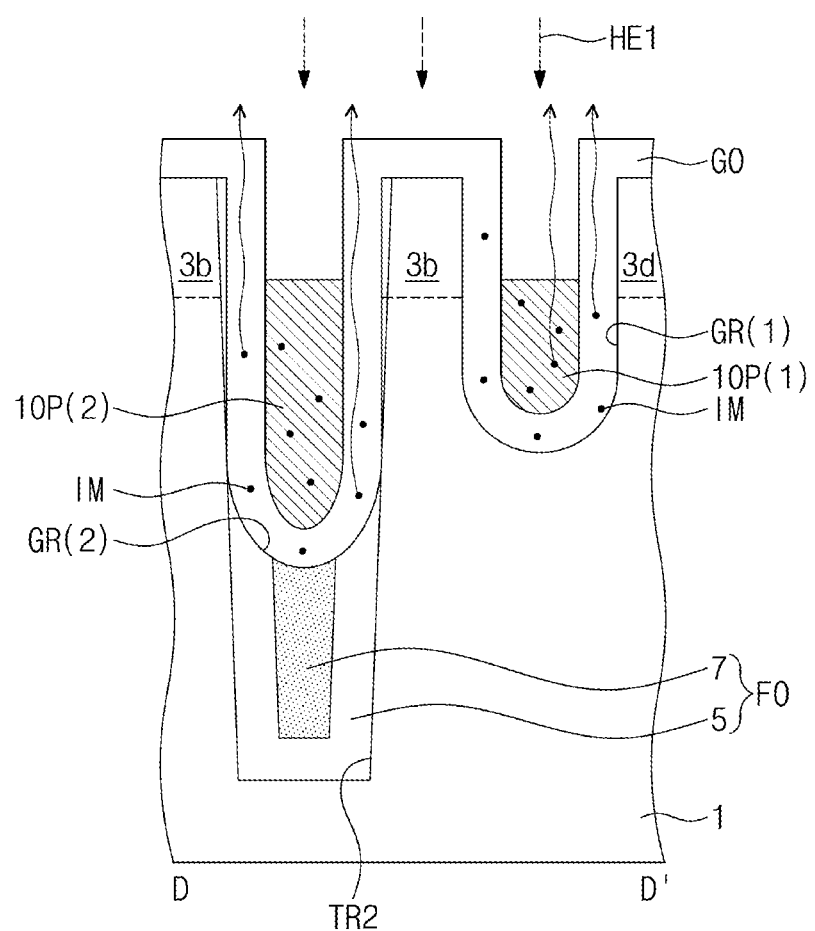
FIG. 14 is a diagram illustrating a phenomenon which occurs in a first thermal treatment process according to an embodiment of the inventive concept.
Figure 15A:
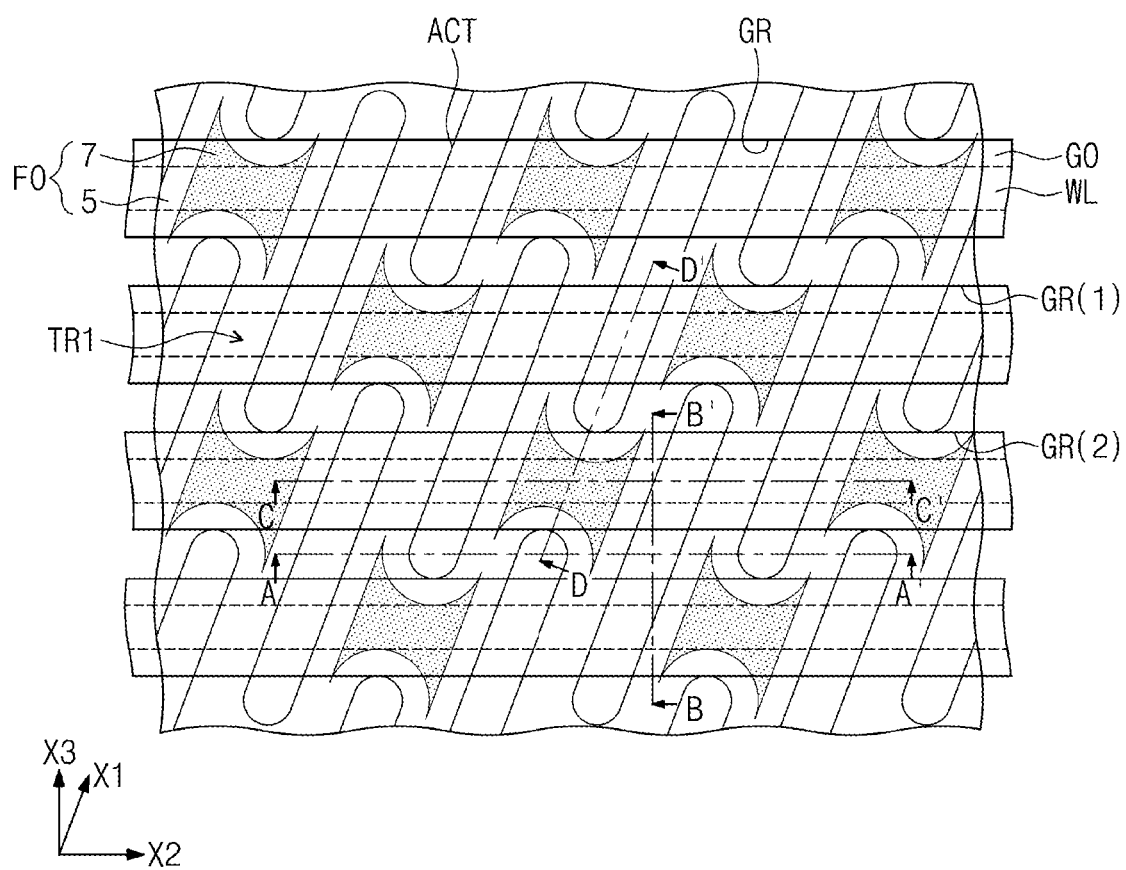
Figure 15B:
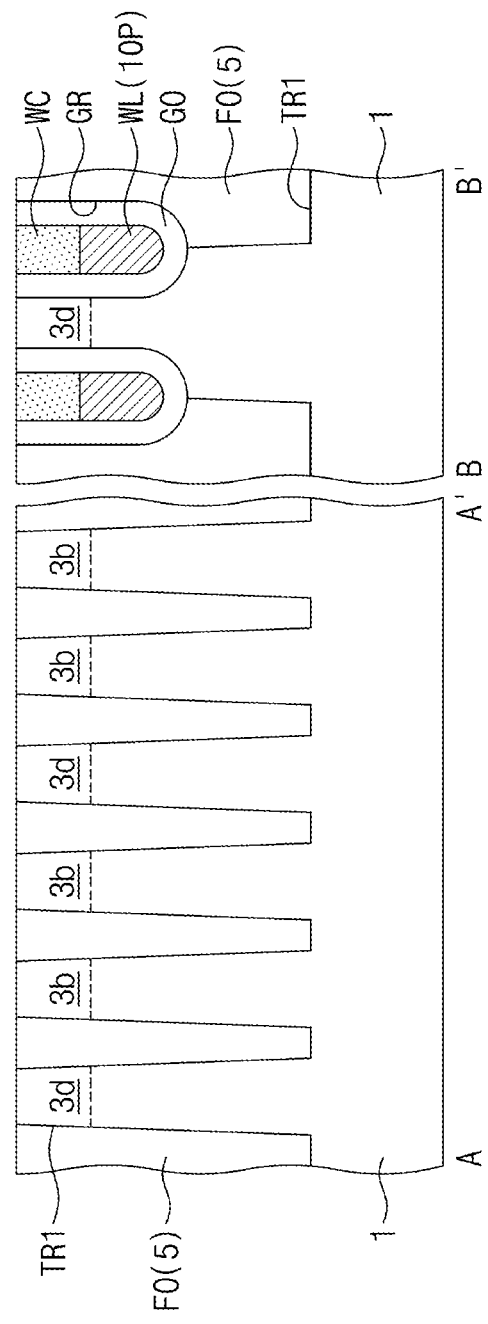
Figure 15C:
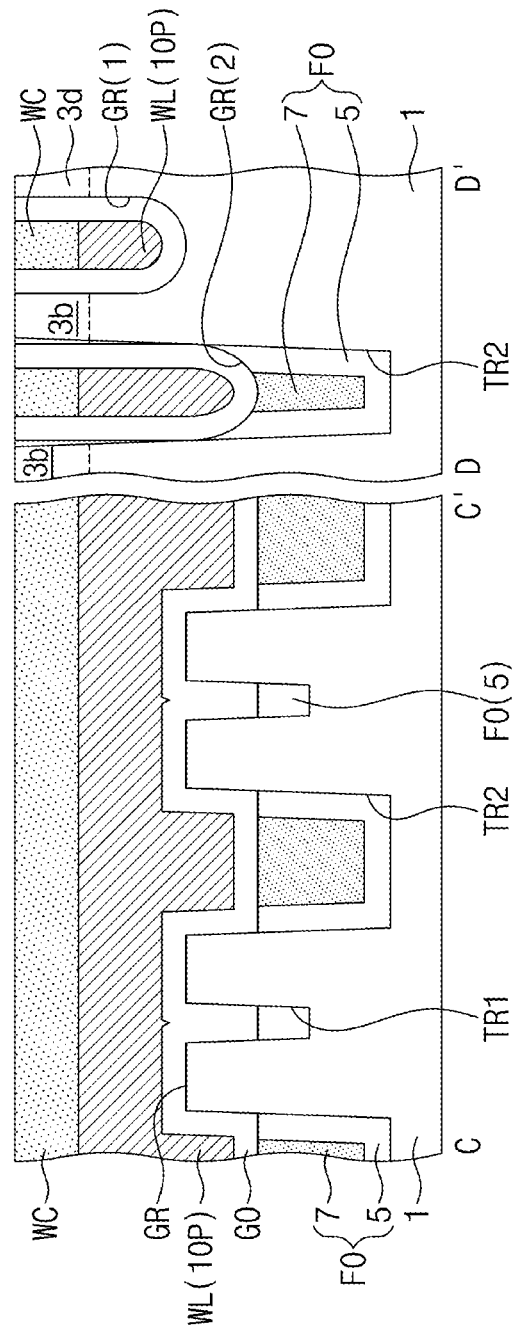

FIG. 14 is a diagram illustrating a phenomenon which occurs in a first thermal treatment process according to an embodiment of the inventive concept.

Referring to FIGS. 7, 13A, 13C, and 14, a first thermal treatment process HE1 may be performed (in S50), after the formation of the first conductive patterns 10P. The first thermal treatment process HE1 may be performed at a high temperature (e.g., from 800 to 1200° C.). The first thermal treatment process HE1 may be one of a rapid thermal anneal (RTA) process, a spike rapid thermal anneal (SRTA) process, a flash rapid thermal anneal (FRTA) process, a laser anneal process, a furnace anneal process, and a furnace/laser anneal process.

The halogen element, boron, nitrogen, carbon, or hydrogen, which is included in the source gases and the etchants, may be left in the gate insulating layer GO and the first conductive patterns 10P and may serve as impurities IM. If the impurities IM are present after the fabrication of the semiconductor device, interface traps may be increased and a mean size of grains may be decreased. In this case, a leakage current may be increased and an operation speed may be lowered. This may lead to deterioration in reliability of the semiconductor device.

According to an embodiment of the inventive concept, by performing the first thermal treatment process HE1, it may be possible to remove the impurities IM from the gate insulating layer GO and the first conductive patterns 10P. Due to the high temperature environment in the first thermal treatment process HE1, the impurities IM may be exhausted or outgassed to the outside, as depicted by the solid arrows. In addition, the first conductive patterns 10P may be crystallized. As a result, the first conductive patterns 10P may have the first grains TG, as shown in FIG. 4.

It may be difficult to exhaust or outgas impurities IM, which are placed in a relatively deep region, to the outside, because a length of the outgassing path is relatively long. For example, in FIG. 14, impurities IM in a relatively shallow region (e.g., the first conductive pattern 10P(1) in the first groove GR(1)) may be more easily exhausted to the outside, compared with impurities IM in a relatively deep region (e.g., the first conductive pattern 10P(2) in the second groove GR(2)). As a result, as described above, there may be a difference in impurity content between the first to third conductive portions 10a to 10c and the first to fourth insulating portions G1 to G4, caused by a difference in depth between them.

Furthermore, due to this difference in the impurity content, there may be a difference between the mean sizes D1 to D3 of the first grains TG, as described with reference to FIG. 4. When the first grains TG of the first conductive patterns 10P are formed or grown, resistance caused by the gate insulating layer GO may be relatively weak near an entrance of the groove GR, and thus, the first grains TG in the first conductive portion 10a, which is closest to the entrance of the groove GR, may have the largest mean size (e.g., the first mean size D1).

Since the first thermal treatment process HE1 is performed after the etch-back process of thinning the first conductive layer 10, the impurities IM in the first conductive layer 10 may be more easily exhausted or outgassed to the outside. If the first thermal treatment process HE1 is performed before the etch-back process on the first conductive layer 10, it may be difficult to effectively remove the impurity IM, because the first conductive layer 10 is thick and the gate insulating layer GO is also covered with the first conductive layer 10. In addition, in the case where the first thermal treatment process HE1 is performed after the etch-back process on the first conductive layer 10, the impurity IM, which is produced by an etching gas, may also be removed. This may make it possible to further improve the reliability of the semiconductor device.

Referring to FIGS. 7, 15A, 15B, and 15C, the word line capping pattern WC may be formed in the groove GR (in S60). For this, a word line capping layer (not shown) may be formed on the substrate 1 to fill an upper portion of the groove GR, and an etch-back or CMP process may be performed on the word line capping layer to expose the top surface of the substrate 1. Thereafter, the bit line BL, the bit line contact DC, the storage node contact BC, and the landing pads LP described with reference to FIGS. 1, 2A, and 2B may be formed (e.g., by a typical/conventional process).

Figure 16A:
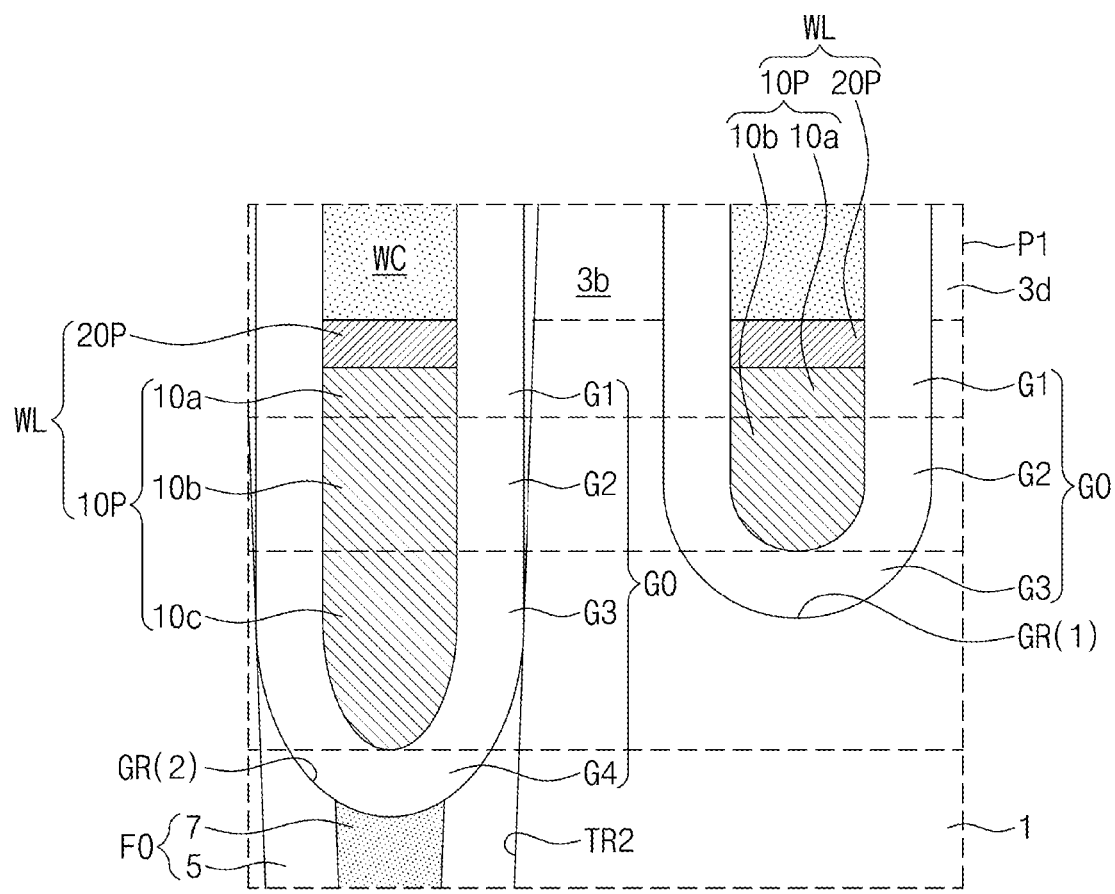
FIG. 16A is an enlarged sectional view illustrating a portion (e.g., 'P1' of FIG. 2B) of a semiconductor device according to an embodiment of the inventive concept.
Figure 16B:
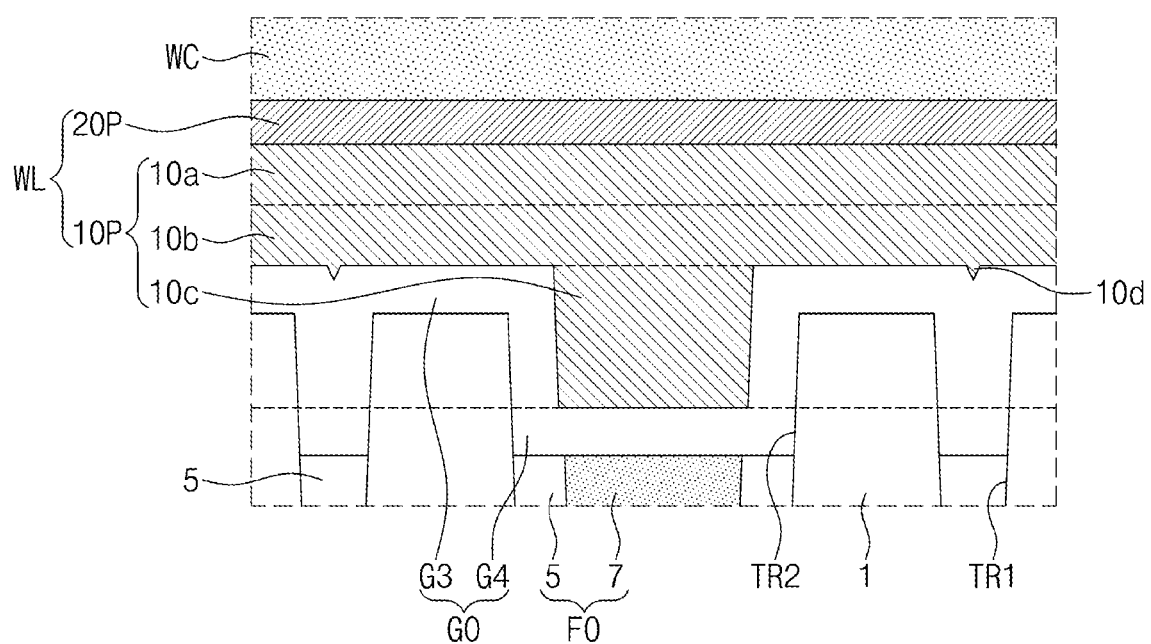
FIG. 16B is an enlarged sectional view illustrating a portion (e.g., 'P2' of FIG. 2B) of a semiconductor device according to an embodiment of the inventive concept.
Figure 16C:
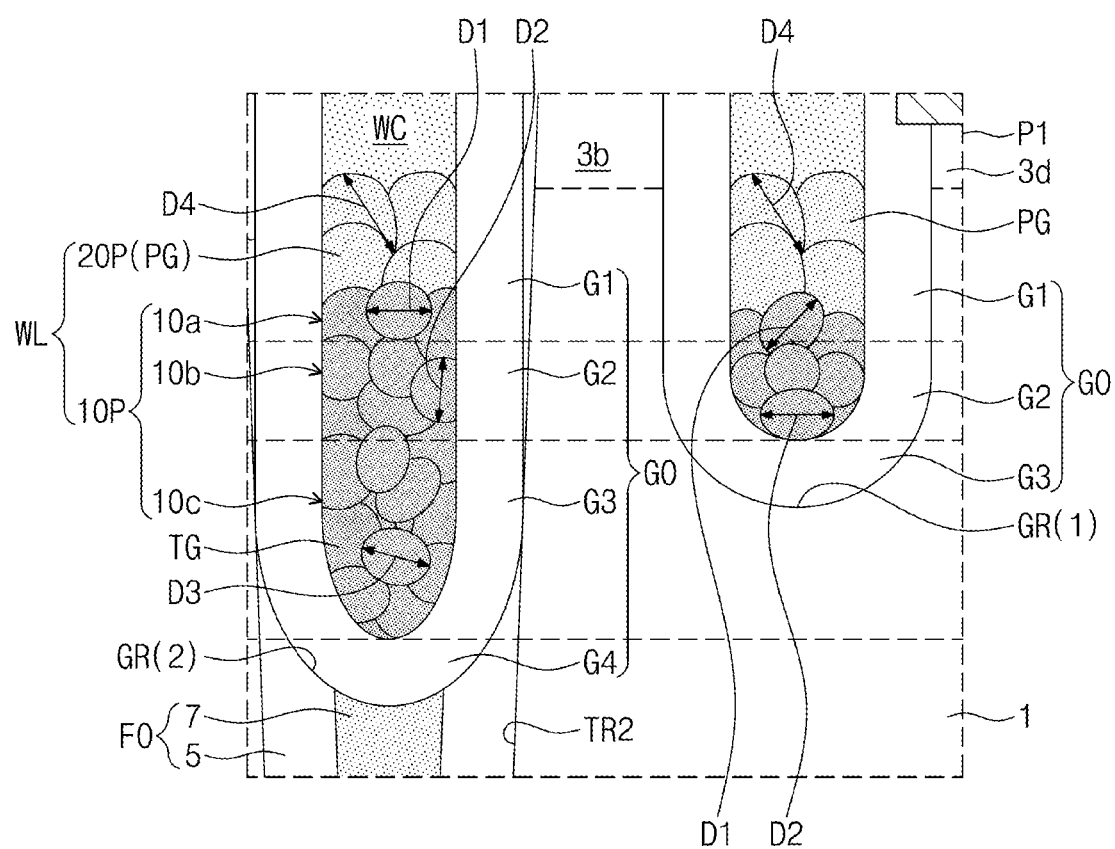
FIG. 16C is an enlarged sectional view illustrating a portion (e.g., 'P1' of FIG. 2B) of a semiconductor device according to an embodiment of the inventive concept.
Figure 16D:
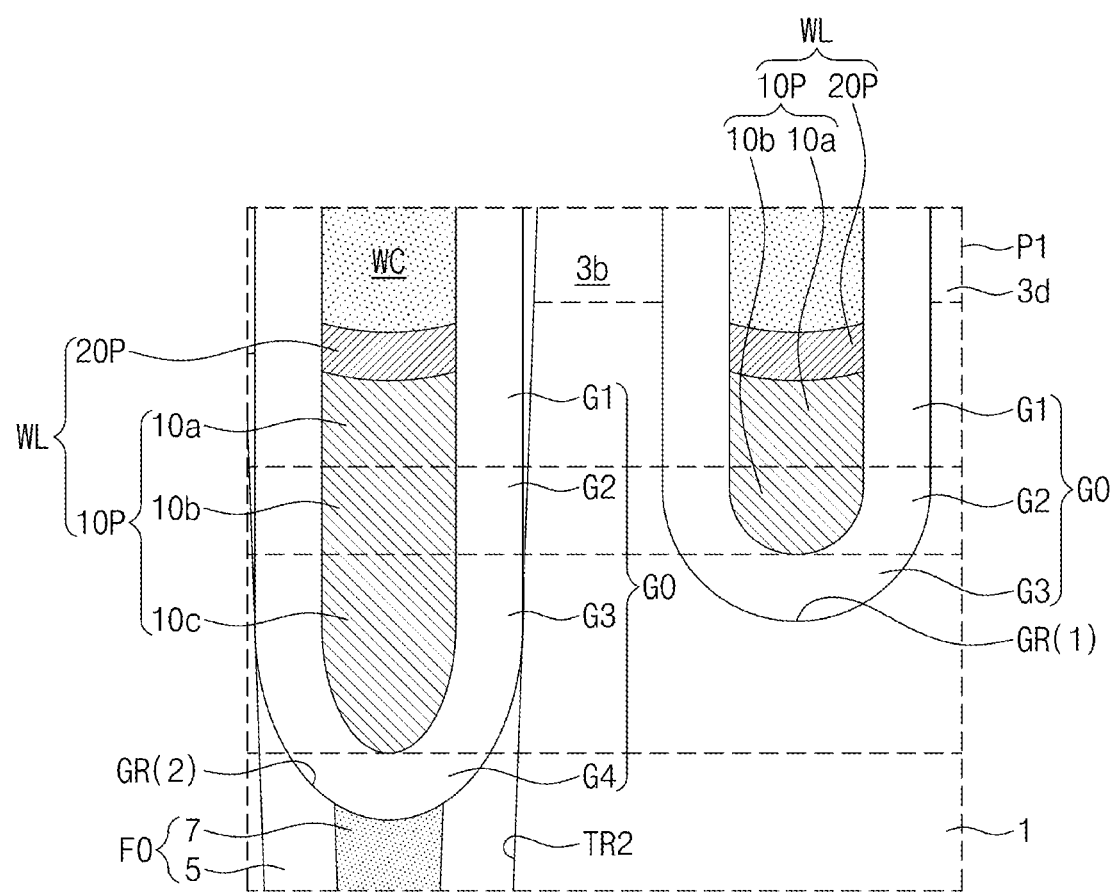
FIG. 16D is an enlarged sectional view illustrating a portion (e.g., 'P1' of FIG. 2B) of a semiconductor device according to an embodiment of the inventive concept.

FIG. 16A is an enlarged sectional view illustrating a portion (e.g., 'P1' of FIG. 2B) of a semiconductor device according to an embodiment of the inventive concept. FIG. 16B is an enlarged sectional view illustrating a portion (e.g., 'P2' of FIG. 2B) of a semiconductor device according to an embodiment of the inventive concept. FIG. 16C is an enlarged sectional view illustrating a portion (e.g., 'P1' of FIG. 2B) of a semiconductor device according to an embodiment of the inventive concept. FIG. 16D is an enlarged sectional view illustrating a portion (e.g., 'P1' of FIG. 2B) of a semiconductor device according to an embodiment of the inventive concept.

Referring to FIGS. 16A and 16B, the word line WL may further include a second conductive pattern 20P interposed between the first conductive pattern 10P and the word line capping pattern WC. Any other conductive pattern may not be interposed between the second conductive pattern 20P and the gate insulating layer GO. The first conductive pattern 10P may be formed of a first conductive material. The second conductive pattern 20P may be formed of a second conductive material. A second work function of the second conductive material may be greater than a first work function of the first conductive material. Due to this difference in the work function, it may be possible to reduce a magnitude of an electric field near the second conductive pattern 20P adjacent to the first and second impurity regions 3d and 3b, when the word line WL is used for an OFF operation. Accordingly, a leakage current in the OFF operation may be reduced. Furthermore, due to the difference in the work function, it may be possible to improve an inversion property near the second conductive pattern 20P and to increase an ON current, when the word line WL is used for an ON operation. Accordingly, it may be possible to improve controllability of the word line WL in the ON/OFF operations. In an embodiment, the first work function may be less than or equal to 4.2 eV, and the second work function may be greater than or equal to 4.4 eV. In an embodiment, the second conductive material may be polysilicon, or silicon germanium, which is doped with an impurity (e.g., phosphorus or boron).

Referring to FIG. 16C, the second conductive pattern 20P may include second grains PG of the second conductive material. The second grains PG may have a fourth mean size D4. The fourth mean size D4 may be larger than the first mean size D1 of the first grains TG. Except for this difference, the semiconductor device may have substantially the same features as those described with reference to FIG. 4.

Referring to FIG. 16D, the first conductive pattern 10P may have a concave top surface. This may result from the etch-back process of FIG. 12A. The second conductive pattern 20P may also have a concave top surface. The word line capping pattern WC may have a downwardly convex bottom surface. Except for these differences, other portions of the semiconductor device may have the same or similar features as described with reference to FIGS. 1-4.

Figure 17:
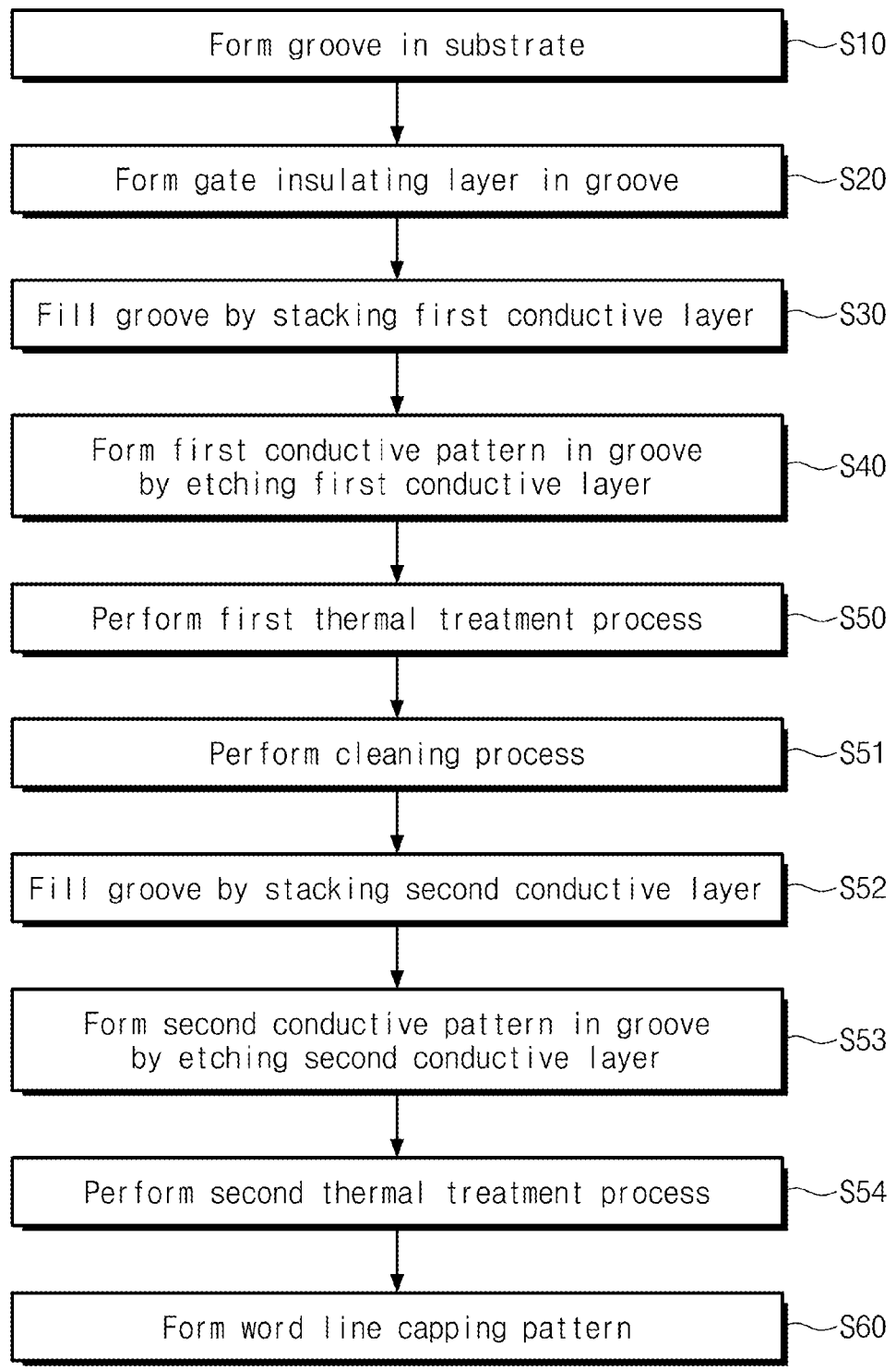
FIG. 17 is a flow chart illustrating a method of fabricating a semiconductor device according to an embodiment of the inventive concept.
Figure 18:
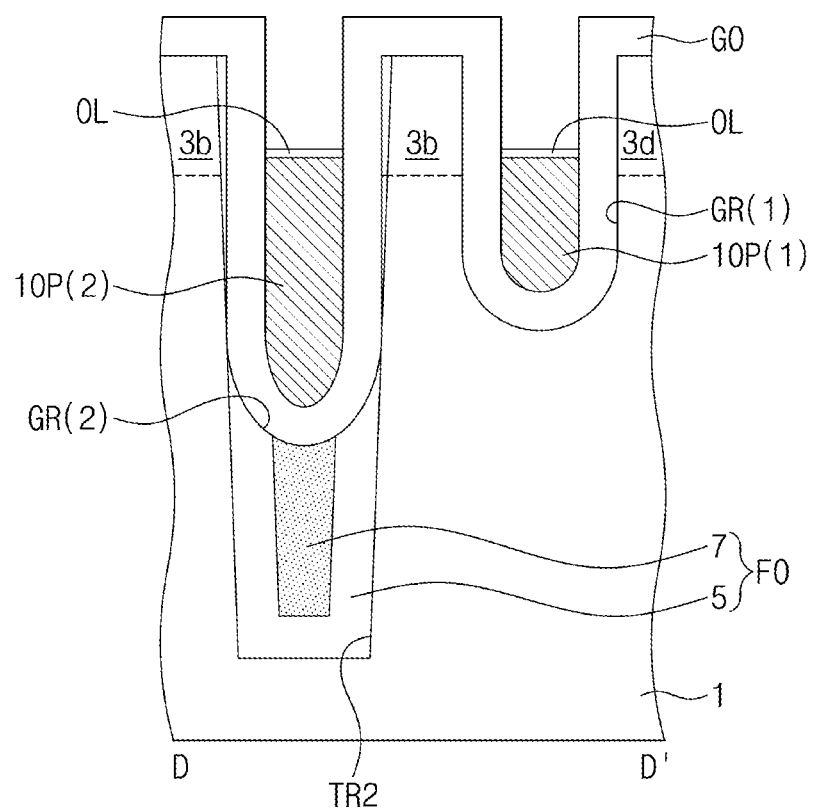
FIG. 18 is a sectional view illustrating a portion of a fabrication process according to an embodiment of the inventive concept.
Figure 19A:
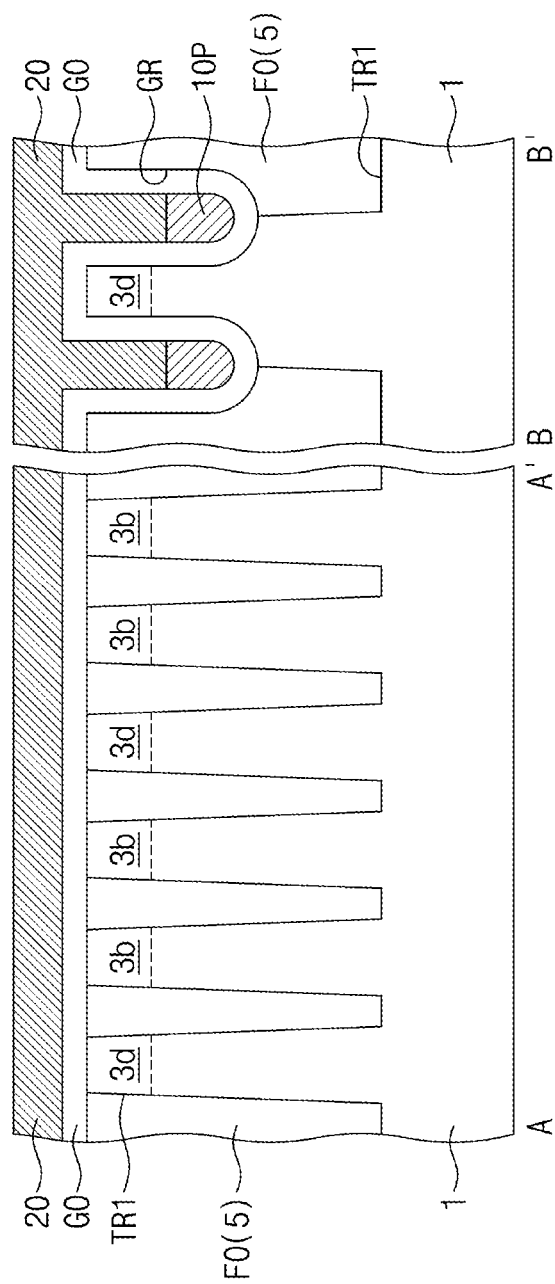
FIGS. 19A, 20A, and 21A are sectional views sequentially illustrating a process of fabricating the semiconductor device of FIGS. 16A and 16B.
Figure 19B:
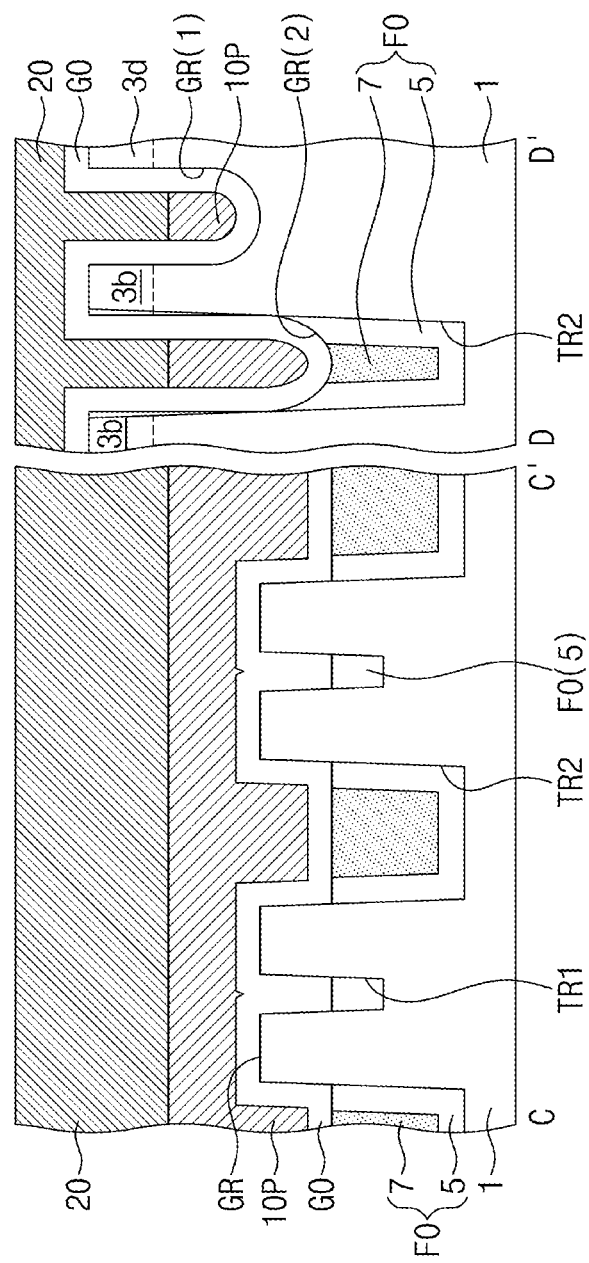
FIGS. 19B, 20B, and 21B are sectional views sequentially illustrating a process of fabricating the semiconductor device of FIGS. 16A and 16B.
Figure 20A:
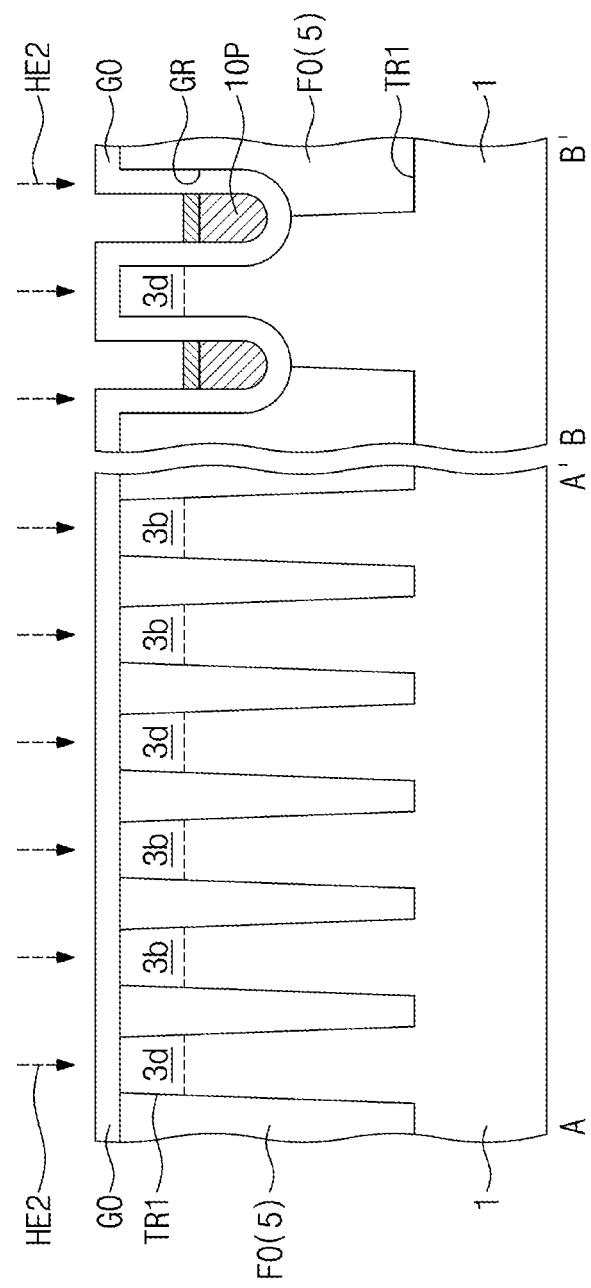
Figure 20B:
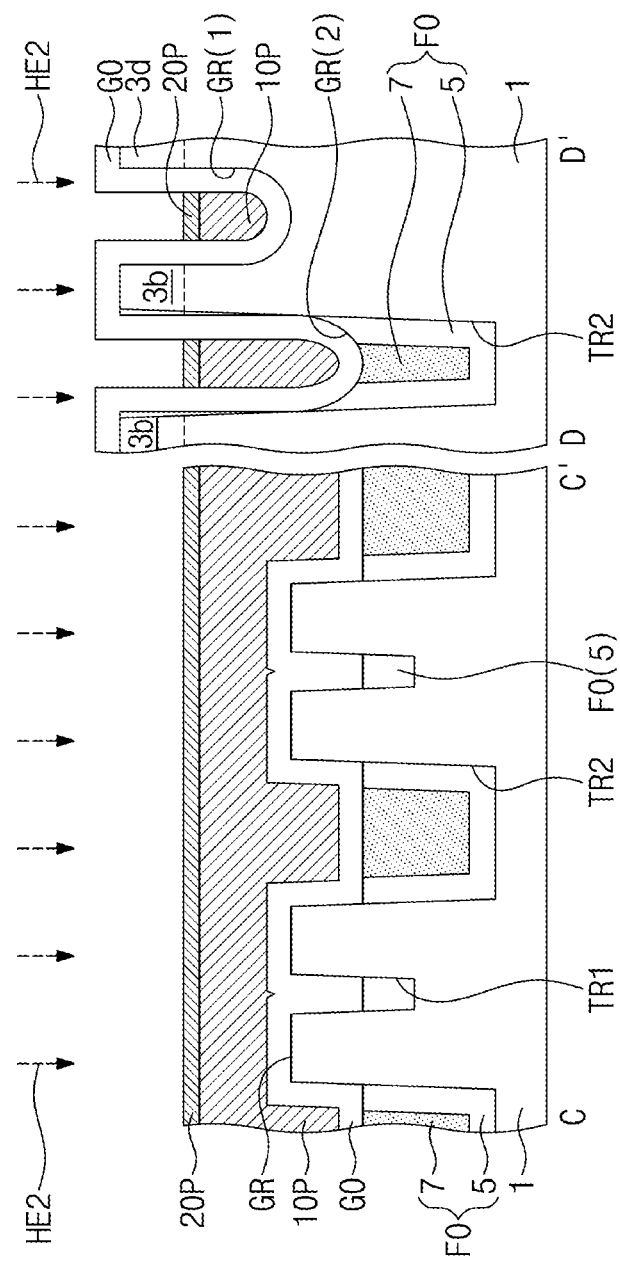
Figure 21A:
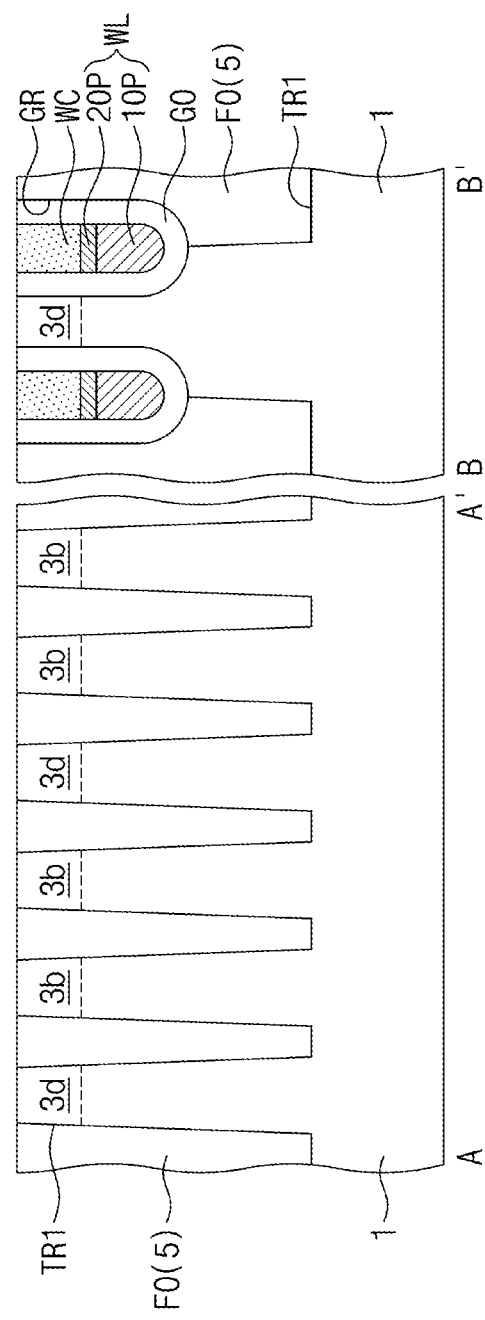
Figure 21B:
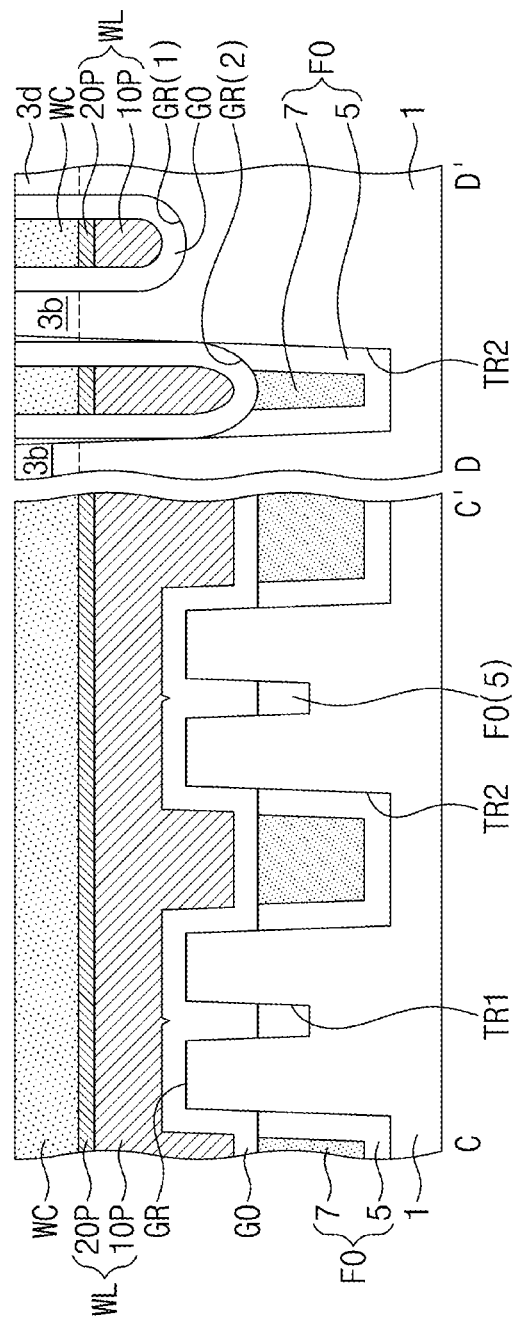

FIG. 17 is a flow chart illustrating a method of fabricating a semiconductor device according to an embodiment of the inventive concept. FIG. 18 is a sectional view illustrating a portion of a fabrication process according to an embodiment of the inventive concept. FIGS. 19A, 20A, and 21A are sectional views sequentially illustrating a process of fabricating the semiconductor device of FIGS. 16A and 16B. FIGS. 19B, 20B, and 21B are sectional views sequentially illustrating a process of fabricating the semiconductor device of FIGS. 16A and 16B.

Referring to FIGS. 17 and 18, the steps S10 to S50 may be performed in the same manner as those described with reference to FIG. 7. Before the formation of the word line capping pattern WC, the second conductive pattern 20P may be formed on the first conductive pattern 10P. For this, after the first thermal treatment process HE1 (in S50) described with reference to FIGS. 7, 13A, and 13B, a natural oxide layer OL may be formed on the first conductive pattern 10P. In some embodiments, after the first thermal treatment process HE1 (in S50), a cleaning process may be performed (in S51). In this case, the natural oxide layer OL may be removed.

Referring to FIGS. 17, 19A, and 19B, after the removal of the natural oxide layer OL, a second conductive layer 20 may be formed on the substrate 1 to fill an upper portion of the groove GR (in S52). In an embodiment, the second conductive layer 20 may be formed of a doped poly-silicon layer. The second conductive layer 20 may be formed by a CVD or ALD process including a step of supplying a source gas. Since the natural oxide layer OL is removed, the second conductive layer 20 may be in contact with the first conductive pattern 10P.

Referring to FIGS. 17, 20A, and 20B, the second conductive layer 20 may be etched back to form the second conductive pattern 20P in the groove GR (in S53). Here, an upper portion of the gate insulating layer GO in the groove GR may be exposed. Thereafter, a second thermal treatment process HE2 may be performed (in S54). The second thermal treatment process HE2 may be performed at a high temperature. For example, the second thermal treatment process HE2 may be performed at a temperature of 800 to 1200° C. The second thermal treatment process HE2 may be one of a rapid thermal anneal (RTA) process, a spike rapid thermal anneal (SRTA) process, a flash rapid thermal anneal (FRTA) process, a laser anneal process, a furnace anneal process, and a furnace/laser anneal process.

As described with reference to FIG. 14, the second conductive pattern 20P and the gate insulating layer GO may contain impurities IM which are produced by the source gas, which is used to form the second conductive layer 20, and the etchant, which is used in the etch-back process on the second conductive layer 20. As a result of the second thermal treatment process HE2, the impurities IM may be removed from the second conductive pattern 20P and the gate insulating layer GO. In addition, the second conductive material constituting the second conductive pattern 20P may be crystallized to form the second grains PG, as shown in FIG. 16C. This may make it possible to improve reliability of the semiconductor device. Next, referring to FIGS. 17, 21A, and 21B, the word line capping pattern WC may be formed (in S60). Thereafter, the bit line BL, the bit line contact DC, the storage node contact BC, and the landing pads LP described with reference to FIGS. 1, 2A, and 2B may be formed (e.g., by a conventional/typical process).

In a semiconductor device according to an embodiment of the inventive concept, a word line may consist of a conductive pattern that is of a single structure in (e.g., filling) at least a lower portion of a groove. Thus, it may be possible to reduce the resistivity of the word line and thereby to increase an operation speed of the semiconductor device. The semiconductor device according to an embodiment of the inventive concept may have a small Nit index and a small tRDL, and thus, the semiconductor device may have an improved reliability property.

In a method of fabricating a semiconductor device according to an embodiment of the inventive concept, to form a word line, a conductive layer may be etched back to form a conductive pattern, and then, a high temperature thermal treatment process may be performed to effectively remove impurities. Accordingly, it may be possible to fabricate a semiconductor device with improved reliability.

While example embodiments of the inventive concept have been particularly shown and described, it will be understood by one of ordinary skill in the art that variations in form and detail may be made therein without departing from the scope of the attached claims.

What is claimed is:

1. A semiconductor device comprising:
    a substrate having a groove therein extending in a first direction;
    a gate insulating layer in the groove;
    a device isolation layer in the substrate and defining an active region, wherein the groove extends into the device isolation layer;
    a first conductive pattern in the groove and on the gate insulating layer; and
    a word line capping pattern in the groove and on the first conductive pattern,
    wherein the first conductive pattern comprises a first material,
    wherein the first conductive pattern comprises a first conductive portion that is adjacent to the word line capping pattern and a second conductive portion that is adjacent to a bottom end of the groove,
    wherein a largest dimension of a grain of the first material of the first conductive portion is equal to or larger than a largest dimension of a grain of the first material of the second conductive portion, and
    wherein sidewalls of the first and second conductive portions are in contact with the gate insulating layer.

2. The semiconductor device of claim 1,
    wherein the first conductive portion and the second conductive portion extend in the first direction, wherein the first conductive pattern further comprises a third conductive portion protruding downwardly from the second conductive portion,
wherein the gate insulating layer is on a bottom surface of the third conductive portion and a side surface of the second conductive portion, and
wherein a largest dimension of a grain of the first material of the third conductive portion is equal to or smaller than the largest dimension of the grain of the first material of the second conductive portion.

3. The semiconductor device of claim 1,
wherein the gate insulating layer has a first insulating portion below the second conductive portion,
wherein at least one of the first insulating portion, the first conductive portion, or the second conductive portion comprises an impurity, and
wherein an impurity content of the first conductive portion is lower than an impurity content of the first insulating portion.

4. The semiconductor device of claim 3,
wherein an impurity content of the second conductive portion is lower than the impurity content of the first insulating portion, and
wherein the groove is free of any metal therein other than the first material of the first conductive pattern.

5. The semiconductor device of claim 3,
wherein the first conductive portion and the second conductive portion extend in the first direction,
wherein the first conductive pattern further comprises a third conductive portion protruding downwardly from the second conductive portion,
wherein the gate insulating layer further comprises a second insulating portion below the third conductive portion, and
wherein an impurity content of the second insulating portion is higher than the impurity content of the first insulating portion.

6. The semiconductor device of claim 3,
wherein the gate insulating layer further comprises a second insulating portion beside the first conductive portion, and
wherein an impurity content of the second insulating portion is lower than the impurity content of the first insulating portion.

7. The semiconductor device of claim 1, further comprising a second conductive pattern between the word line capping pattern and the first conductive pattern,
wherein a work function of the second conductive pattern is greater than a work function of the first conductive pattern.

8. The semiconductor device of claim 1, further comprising a second conductive pattern between the word line capping pattern and the first conductive pattern,
wherein the second conductive pattern comprises a second material, and
wherein a largest dimension of a grain of the second material in the second conductive pattern is larger than the largest dimension of the grain of the first material of the first conductive portion.

9. The semiconductor device of claim 1,
wherein the gate insulating layer comprises a first insulating portion that is below the first conductive pattern and is in contact with the substrate and a second insulating portion that is in contact with the device isolation layer,
wherein at least one of the first insulating portion or the second insulating portion comprises an impurity, and
wherein an impurity content of the second insulating portion is higher than an impurity content of the first insulating portion.

10. A semiconductor device comprising:
a substrate having a groove therein extending in a first direction;
a device isolation layer in the substrate and defining an active region, wherein the groove extends into the device isolation layer;
a gate insulating layer in the groove;
a first conductive pattern in the groove and on the gate insulating layer; and
a word line capping pattern in the groove and on the first conductive pattern,
wherein the first conductive pattern comprises a first material,
wherein the first conductive pattern comprises a first conductive portion that is adjacent to the word line capping pattern and a second conductive portion that is adjacent to a bottom end of the groove, sidewalls of the first and second conductive portions are in contact with the gate insulating layer,
wherein the gate insulating layer comprises a first insulating portion below the first conductive pattern,
wherein at least one of the first conductive portion, the second conductive portion, or the first insulating portion comprises an impurity, and
wherein an impurity content of the first conductive portion is lower than an impurity content of the first insulating portion.

11. The semiconductor device of claim 10, wherein an impurity content of the second conductive portion is lower than the impurity content of the first insulating portion.

12. The semiconductor device of claim 10,
wherein the first conductive portion and the second conductive portion extend in the first direction,
wherein the first conductive pattern further comprises a third conductive portion protruding downwardly from the second conductive portion,
wherein the gate insulating layer further comprises a second insulating portion below the third conductive portion, and
wherein an impurity content of the second insulating portion is higher than the impurity content of the first insulating portion.

13. The semiconductor device of claim 10,
wherein the gate insulating layer further comprises a second insulating portion beside the first conductive portion, and
wherein an impurity content of the second insulating portion is lower than the impurity content of the first insulating portion.

14. The semiconductor device of claim 10, wherein a largest dimension of a grain of the first material of the first conductive portion is equal to or larger than a largest dimension of a grain of the first material of the second conductive portion.

15. The semiconductor device of claim 10,
wherein the first conductive portion and the second conductive portion extend in the first direction,
wherein the first conductive pattern further comprises a third conductive portion protruding downwardly from the second conductive portion,
wherein the gate insulating layer is on a bottom surface of the third conductive portion and a side surface of the second conductive portion, and wherein a largest dimension of a grain of the first material of the third conductive portion is equal to or smaller than a largest dimension of a grain of the first material of the second conductive portion.

16. The semiconductor device of claim 10, further comprising a second conductive pattern between the word line capping pattern and the first conductive pattern,
wherein a work function of the second conductive pattern is greater than a work function of the first conductive pattern.

17. A semiconductor device comprising:
a substrate having a groove therein extending in a first direction;
a gate insulating layer in the groove;
a first conductive pattern in the groove and on the gate insulating layer;
a word line capping pattern in the groove and on the first conductive pattern;
a second conductive pattern between the first conductive pattern and the word line capping pattern;
a first impurity region in the substrate at a side of the word line capping pattern;
a second impurity region in the substrate at an opposite side of the word line capping pattern;
a bit line that is on the substrate, extends in a second direction crossing the first direction, and is electrically connected to the first impurity region;
a bit line contact between the bit line and the first impurity region;
a bit line capping pattern on the bit line;
a storage node contact on the second impurity region; and
a landing pad on the storage node contact and on the bit line capping pattern,
wherein the first conductive pattern comprises a first material,
wherein the second conductive pattern comprises a second material,
wherein a work function of the second material is greater than a work function of the first material,
wherein the first conductive pattern comprises a first conductive portion that is adjacent to the word line capping pattern and a second conductive portion that is adjacent to a bottom end of the groove,
wherein the gate insulating layer comprises a first insulating portion below the first conductive pattern,
wherein at least one of the first conductive portion, the second conductive portion, or the first insulating portion comprises an impurity,
wherein an impurity content of the first conductive portion is lower than an impurity content of the first insulating portion,
wherein a largest dimension of a grain of the second material in the second conductive pattern is larger than a largest dimension of a grain of the first material in the first conductive pattern, and
wherein the largest dimension of the grain of the first material ranges from 10 nanometers (nm) to 20 nm.

18. The semiconductor device of claim 17,
wherein the first conductive portion and the second conductive portion extend in the first direction,
wherein the first conductive pattern further comprises a third conductive portion protruding downwardly from the second conductive portion,
wherein the gate insulating layer further comprises a second insulating portion below the third conductive portion, and
wherein an impurity content of the second insulating portion is higher than the impurity content of the first insulating portion.

19. The semiconductor device of claim 17, wherein a largest dimension of a grain of the first material of the first conductive portion is equal to or larger than a largest dimension of a grain of the first material of the second conductive portion.

* * * * *